United States Patent
Yamada et al.

(10) Patent No.: US 9,960,366 B2
(45) Date of Patent: May 1, 2018

(54) ORGANIC LIGHT EMITTING ELEMENT

(71) Applicant: CANON KABUSHIKI KAISHA, Tokyo (JP)

(72) Inventors: Naoki Yamada, Inagi (JP); Jun Kamatani, Tokyo (JP); Yosuke Nishide, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 313 days.

(21) Appl. No.: 14/996,349

(22) Filed: Jan. 15, 2016

(65) Prior Publication Data

US 2016/0211467 A1 Jul. 21, 2016

(30) Foreign Application Priority Data

Jan. 19, 2015 (JP) .................................. 2015-007532

(51) Int. Cl.
*H01L 51/00* (2006.01)
*G03G 15/04* (2006.01)
(Continued)

(52) U.S. Cl.
CPC ... *H01L 51/0072* (2013.01); *G03G 15/04054* (2013.01); *H05B 33/0896* (2013.01); *C09K 11/06* (2013.01); *H01L 51/5092* (2013.01)

(58) Field of Classification Search
CPC .......... G03G 15/04054; H01L 51/0072; H01L 51/5092; H05B 33/0896; C09K 11/06
See application file for complete search history.

(56) References Cited

U.S. PATENT DOCUMENTS 8,158,835 B2   4/2012  Kamatani et al.
8,288,016 B2  10/2012  Hashimoto et al.
(Continued)

OTHER PUBLICATIONS

A. Chrzqszczewska et al., "N.N'-DI-p-Tolyldiacridine Nitrate," Lodz. Towarz. Nauk: Wydzial III, Acta Chim. vol. 3, pp. 93-97 (1958).

(Continued)

*Primary Examiner* — Dawn L Garrett
(74) *Attorney, Agent, or Firm* — Fitzpatrick, Cella, Harper & Scinto

(57) ABSTRACT

Provided is an organic light emitting element that has high moisture resistance, is driven at a low voltage, has high efficiency, and has a long lifetime. Specifically, provided is an organic light emitting element, including: an anode; a cathode; and an organic compound layer arranged between the anode and the cathode, in which: the organic compound layer includes an organic functional layer; and the organic functional layer contains an organic compound represented by the following general formula [1].

(Continued)

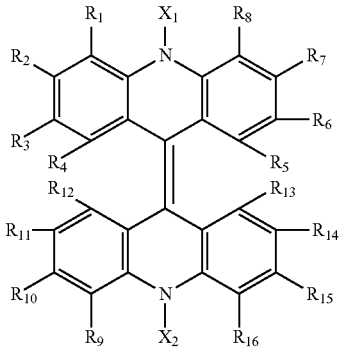

14 Claims, 2 Drawing Sheets

(51) Int. Cl.
*H05B 33/08* (2006.01)
*H01L 27/32* (2006.01)
*G09G 3/32* (2016.01)
*H01L 51/50* (2006.01)
*C09K 11/06* (2006.01)

(56) References Cited

U.S. PATENT DOCUMENTS

| | | |
|---|---|---|
| 8,580,400 B2 | 11/2013 | Kosuge et al. |
| 2012/0168739 A1 | 7/2012 | Kamatani et al. |
| 2015/0214483 A1 | 7/2015 | Kamatani et al. |
| 2015/0270493 A1 | 9/2015 | Nishide et al. |
| 2015/0295188 A1 | 10/2015 | Kosuge et al. |
| 2015/0303386 A1 | 10/2015 | Kishino et al. |
| 2015/0333279 A1 | 11/2015 | Kamatani et al. |
| 2015/0357586 A1 | 12/2015 | Horiuchi et al. |
| 2015/0357587 A1 | 12/2015 | Kishino et al. |
| 2015/0364701 A1 | 12/2015 | Horiuchi et al. |
| 2015/0364703 A1 | 12/2015 | Miyashita et al. |
| 2015/0372238 A1 | 12/2015 | Yamada et al. |
| 2015/0372244 A1 | 12/2015 | Abe et al. |

OTHER PUBLICATIONS

S. Huacan et al., "Study on the Oxidation of N-Alkylacridans and 10, 10'-DI-Alkyl-9, 9'-Biacridens by Spectrophotometer", Guangpuxue Yu Guangpu Fenxi, vol. 18, issue 6, pp. 669-672 (1998) with English language abstract.

N. D. Sonawane et al., "Chloride Concentration in Endosomes Measure Using a Ratioable Fluorescent Cl-Indicator", J. of Bio. Chem., vol. 277, No. 7, pp. 5506-5513 (2002).

U.S. Appl. No. 14/779,185, filed Sep. 22, 2015.

U.S. Appl. No. 14/784,333, filed Oct. 14, 2015.

ORGANIC LIGHT EMITTING ELEMENT

BACKGROUND OF THE INVENTION

Field of the Invention

The present invention relates to an organic light emitting element.

Description of the Related Art

An organic light emitting element is an element including an anode, a cathode, and an organic compound layer arranged between the electrodes. Holes and electrons injected from the electrodes recombine in an emission layer which is the organic compound layer to produce excitons, and the organic light emitting element emits light upon return of the excitons to the ground state. Recent development of the organic light emitting element is significant, and allows the organic light emitting element to be a light emitting device having the following features: a low drive voltage; light emission at various wavelengths; high-speed responsiveness; a small thickness; and a light weight.

In the organic light emitting element, it is important to improve an electron injection property from the viewpoint of reducing a voltage of the element. An approach to improving the electron injection property is, for example, an approach involving using an alkali metal as a constituent material for the organic light emitting element, in particular, an electron injection material. However, the alkali metal involves a problem in that the metal has high water solubility and hence the moisture resistance of the organic light emitting element reduces. Lodz. Towarz. Nauk: Wydzial III, Acta Chim. (1958), 3, P93-97. discloses a method of synthesizing the following compound a-1 and chemiluminescence involving using the compound. In addition, Guangpuxue Yu Guangpu Fenxi Volume 18 Issue 6 Pages 669-672 1998 discloses charge transfer in a solution using the following compound a-2.

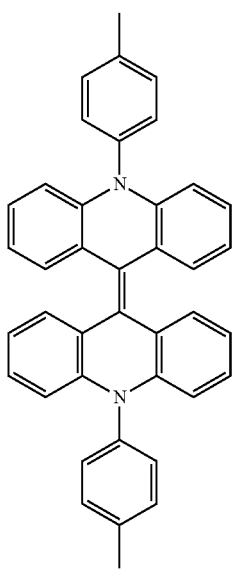

a-1

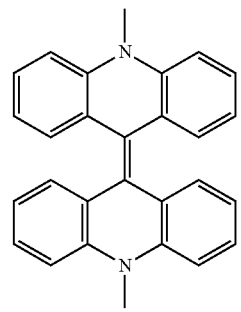

a-2

SUMMARY OF THE INVENTION

The present invention has been accomplished to solve the above-mentioned problems, and the present invention is directed to providing an organic light emitting element that has high moisture resistance, is driven at a low voltage, has high efficiency, and has a long lifetime.

An organic light emitting element according to one aspect of the present invention includes:
an anode;
a cathode; and
an organic compound layer disposed between the anode and the cathode,
in which:
the organic compound layer includes an organic functional layer; and
the organic functional layer contains an organic compound represented by the following general formula [1].

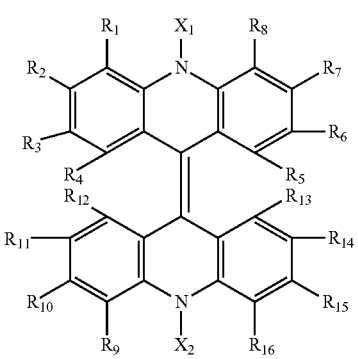

[1]

In the general formula [1], $X_1$ and $X_2$ each represent an aryl group, and the aryl group may further have a halogen atom or an alkyl group, and $R_1$ to $R_{16}$ each represent a hydrogen atom or a substituent selected from a halogen atom, an alkyl group, and an aryl group, and when any one of $R_1$ to $R_{16}$ represents an aryl group, the aryl group may further have a halogen atom or an alkyl group that may have a halogen atom.

Further features of the present invention will become apparent from the following description of exemplary embodiments with reference to the attached drawings.

DESCRIPTION OF THE EMBODIMENTS

Figure 1:
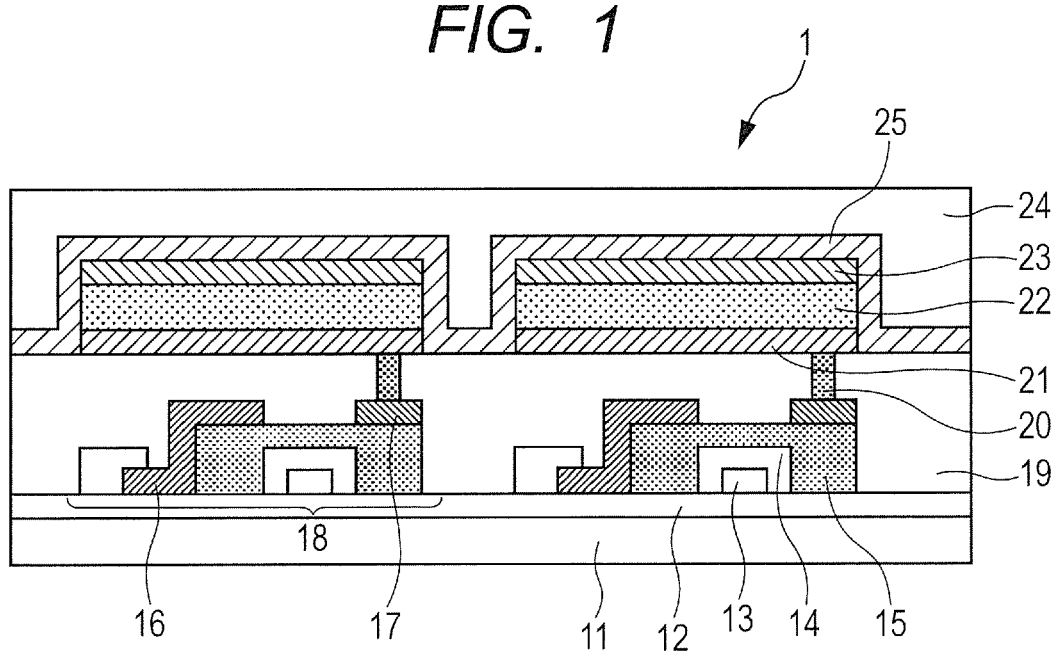
FIG. 1 is a schematic sectional view for illustrating an example of a display apparatus including an organic light emitting element of the present invention and an active element connected to the organic light emitting element.

Preferred embodiments of the present invention will now be described in detail in accordance with the accompanying drawings.

The present invention relates to an organic light emitting element including: an anode; a cathode; and an organic compound layer arranged between the anode and the cathode. In the present invention, the organic compound layer includes an organic functional layer, and the organic functional layer contains an organic compound represented by the following general formula [1].

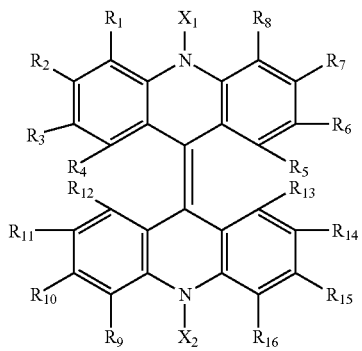

[1]

It is to be noted that details about the compound represented by the general formula [1] are described later.

[Organic Light Emitting Element]

The organic light emitting element of the present invention includes the anode and the cathode serving as a pair of electrodes, and the organic compound layer disposed between these electrodes. The organic light emitting element of the present invention is an organic electric field element in which holes and electrons are supplied from both the electrodes, and hence an organic compound having an emission function emits light.

In the present invention, at least the organic functional layer containing the compound represented by the general formula [1] is included in the organic compound layer constituting the organic light emitting element. The organic functional layer is preferably, so to speak, a layer disposed between an emission layer and the cathode, the layer serving to inject and transport electrons, in terms of the characteristics of the compound represented by the general formula [1]. The organic functional layer is more preferably a layer in contact with the cathode, e.g., an electron injection layer. In addition, the organic functional layer may be disposed as the layer in contact with the cathode, but in the present invention, a layer constituting the organic compound layer may be interposed between the organic functional layer and the cathode.

Specific examples of the construction of the organic light emitting element of the present invention include the following.

(i) (Substrate/)anode/emission layer/electron injection layer/cathode
(ii) (Substrate/)anode/hole transport layer/electron transport layer/electron injection layer/cathode
(iii) (Substrate/)anode/hole transport layer/emission layer/electron transport layer/electron injection layer/cathode
(iv) (Substrate/)anode/hole injection layer/hole transport layer/emission layer/electron transport layer/electron injection layer/cathode
(v) (Substrate/)anode/hole transport layer/emission layer/blocking layer/electron transport layer/electron injection layer/cathode However, in the present invention, the specific construction of the organic light emitting element is not limited to the five kinds of modes. In addition, in each of the five kinds of modes, an electrode close to the substrate, i.e., an electrode on a substrate side is the anode, but in the present invention, a mode in which the electrode on the substrate side is the cathode and the order of the respective layers is reverse to that of any one of the items (i) to (v) is also included in the embodiments of the present invention.

In addition, out of the layers described in any one of the items (i) to (v), each of the hole transport layer, the emission layer, the blocking layer (hole blocking layer), the electron transport layer, and the electron injection layer may be a single layer, or may be a stack formed of a plurality of layers.

[Compound Represented by General Formula [1]]

Next, the compound represented by the following general formula [1] in the organic functional layer is described.

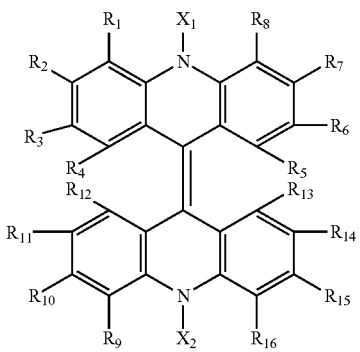

[1]

In the general formula [1], $X_1$ and $X_2$ each represent an aryl group.

Examples of the aryl group represented by $X_1$ or $X_2$ include a phenyl group, a naphthyl group, a pentalenyl group, an indenyl group, an azulenyl group, an anthryl group, a pyrenyl group, an indacenyl group, an acenaphthenyl group, a phenanthryl group, a phenalenyl group, a fluoranthenyl group, an acephenanthryl group, an aceanthryl group, a triphenylenyl group, a chrysenyl group, a naphthacenyl group, a perylenyl group, a pentacenyl group, a biphenyl group, a terphenyl group, and a fluorenyl group.

Of those aryl groups, an aryl group containing two or more benzene rings is preferred from the viewpoint of high moisture resistance. Specific examples of the aryl group containing two or more benzene rings include a naphthyl group, a pentalenyl group, an indenyl group, an azulenyl group, an anthryl group, a pyrenyl group, an indacenyl group, an acenaphthenyl group, a phenanthryl group, a phenalenyl group, a fluoranthenyl group, an acephenanthryl group, an aceanthryl group, a triphenylenyl group, a chrysenyl group, a naphthacenyl group, a perylenyl group, a pentacenyl group, a biphenyl group, a terphenyl group, and a fluorenyl group.

It is to be noted that the aryl group represented by $X_1$ or $X_2$ may further have a halogen atom selected from a chlorine atom, a bromine atom, an iodine atom, and a fluorine atom or an alkyl group selected from a methyl group, an ethyl group, an isopropyl group, a n-propyl group, a s-butyl group, a t-butyl group, a n-pentyl group, a cyclohexyl group, an adamantyl group, and the like.

In the general formula [1], $R_1$ to $R_{16}$ each represent a hydrogen atom or a substituent selected from a halogen atom, an alkyl group, and an aryl group.

Examples of the halogen atom represented by any one of $R_1$ to $R_{16}$ include a chlorine atom, a bromine atom, an iodine atom, and a fluorine atom.

Examples of the alkyl group represented by any one of $R_1$ to $R_{16}$ include a methyl group, an ethyl group, an isopropyl group, a n-propyl group, a s-butyl group, a t-butyl group, a n-pentyl group, a cyclohexyl group, and an adamantyl group. Of those, in the present invention, a substituent selected from alkyl groups each having 1 to 4 carbon atoms, i.e., a methyl group, an ethyl group, an isopropyl group, a n-propyl group, a s-butyl group, and a t-butyl group is preferred because stability against thermal decomposition or the like becomes high when the alkyl group represented by any one of $R_1$ to $R_{16}$ is an alkyl group having 1 to 4 carbon atoms.

Examples of the aryl group represented by any one of $R_1$ to $R_{16}$ include a phenyl group, a naphthyl group, a pentalenyl group, an indenyl group, an azulenyl group, an anthryl group, a pyrenyl group, an indacenyl group, an acenaphthenyl group, a phenanthryl group, a phenalenyl group, a fluoranthenyl group, an acephenanthryl group, an aceanthryl group, a triphenylenyl group, a chrysenyl group, a naphthacenyl group, a perylenyl group, a pentacenyl group, a biphenyl group, a terphenyl group, and a fluorenyl group. Of those, as in the case of $X_1$ and $X_2$ in the general formula [1], an aryl group containing two or more benzene rings is preferred as the aryl group represented by any one of $R_1$ to $R_{16}$.

It is to be noted that when any one of $R_1$ to $R_{16}$ represents an aryl group, the aryl group may further have a halogen atom selected from a chlorine atom, a bromine atom, an iodine atom, and a fluorine atom or an alkyl group that may have the halogen atom (e.g., a substituent obtained by introducing the halogen atom into an alkyl group such as a methyl group, an ethyl group, an isopropyl group, a n-propyl group, a s-butyl group, a t-butyl group, a n-pentyl group, a cyclohexyl group, or an adamantyl group).

The present invention can provide, in particular, an organic light emitting element that can be driven at a low voltage because the compound represented by the general formula [1] is included in the electron injection layer to accelerate the injection of electron from the cathode. The mechanism for the electron injection is described below.

A biacridinidene skeleton serving as the basic skeleton of the compound represented by the general formula [1] has an extremely low oxidation potential (i.e., small ionization energy) and hence has an extremely high electron donor property. Accordingly, it is assumed that the skeleton interacts with any other material in the electron injection layer functioning as an electron accepting compound, a material for the adjacent electron transport layer, or a material for the adjacent hole blocking layer to cause charge separation. Thus, the skeleton accelerates the injection of an electron from the cathode to contribute to a reduction in drive voltage of the organic light emitting element.

However, not every compound having a biacridinidene skeleton can be used as a constituent material for the organic light emitting element, specifically an electron injection material. It is assumed that when $X_1$ and $X_2$ in the general formula [1] each represent an aryl group, the following physical properties peculiar to the compound significantly improve, and hence the characteristics of the organic light emitting element can be improved.

(1) Improvement in Water Resistance

That is, an improvement in water dissolution resistance of the compound can improve the resistance of the organic light emitting element to degradation due to moisture. Accordingly, encapsulation for keeping the moisture resistance of the element can be facilitated.

The electron injection layer constituting the organic light emitting element of the present invention is free of any alkali metal having a high moisture-absorbing property unlike a mode in which the layer contains an alkali metal, such as lithium fluoride, lithium aluminum hydride, cesium carbonate, or lithium quinolinol. Accordingly, the degradation of the electron injection layer due to water caused by its absorption of moisture in the air is small. Further, for example, a compound in which $X_1$ and $X_2$ in the general formula [1] each represent an alkyl group like the compound a-2 disclosed in Lodz. Towarz. Nauk: Wydzial III, Acta Chim. (1958), 3, P93-97, and a compound like a compound a-3 in which $X_1$ and $X_2$ each represent an aryl group are compared.

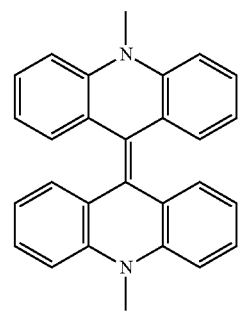

a-2

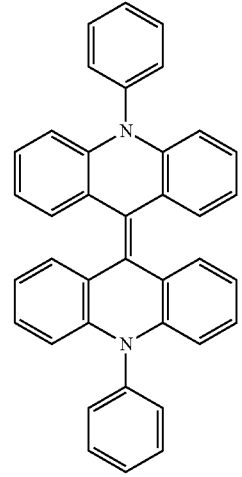

a-3

In this case, the compound itself in which $X_1$ and $X_2$ each represent an aryl group has higher hydrophobicity than that of the other compound. Thus, the water dissolution resistance of the compound itself further improves. In addition, when an aryl group containing two or more benzene rings out of the aryl groups is introduced into one of $X_1$ and $X_2$, the water resistance of the compound itself further improves. Further, when, in the compound represented by the general formula [1], at least part of the substituents ($X_1$, $X_2$, and $R_1$ to $R_{16}$) in the formula are each a substituent having a fluorine atom, the water repellency of the compound itself improves and hence the water resistance further improves.

(2) Improvement in Film Stability

That is, an amorphous film that is stable over a long time period can be formed from the compound, and hence the organic light emitting element hardly degrades even when the element is driven for a long time period.

The electron injection layer constituting the organic light emitting element is in contact with the cathode. Accordingly, the stability of an amorphous film formed of the compound against moisture permeating from the cathode is required for the layer out of the layers in the organic compound layer. Accordingly, in the case of the compound in which $X_1$ and $X_2$ each represent an alkyl group out of the compounds each represented by the general formula [1], it is assumed that its glass transition temperature is low and hence it is difficult to form an amorphous film that is stable over a long time period. On the other hand, in the case of the compound in which $X_1$ and $X_2$ in the general formula [1] each represent an aryl group, the compound being incorporated into the organic light emitting element of the present invention, its glass transition temperature is high and hence an amorphous film that is stable over a long time period is formed. Incidentally, in the compound a-3, $X_1$ and $X_2$ in the general formula [1] each represent a phenyl group, but its glass transition temperature is 245° C., which is a physical property by which an amorphous film that is stable over a long time period can be formed. Here, when $X_1$ and $X_2$ each represent an aryl group containing two or more benzene rings, the glass transition temperature of the compound itself further increases.

Specific examples of the compound represented by the general formula [1] are listed below. However, the present invention is not limited to these specific examples.

A-1

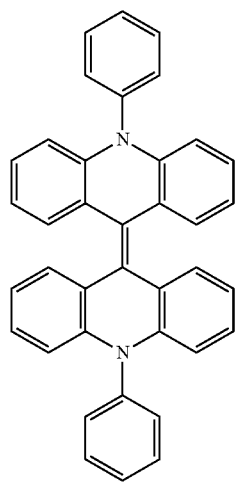

-continued

A-2

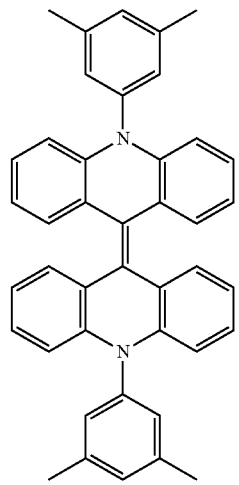

A-3

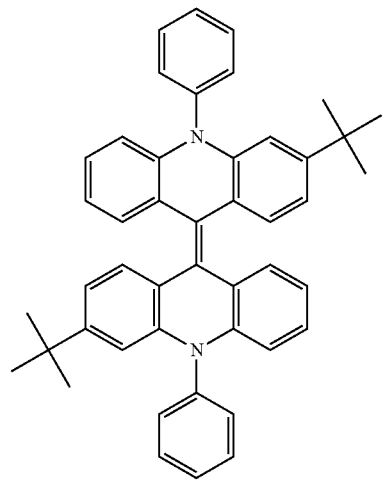

A-4

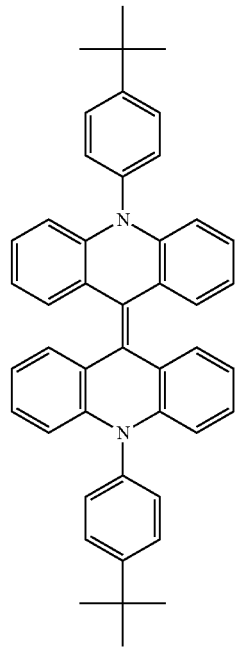

A-5
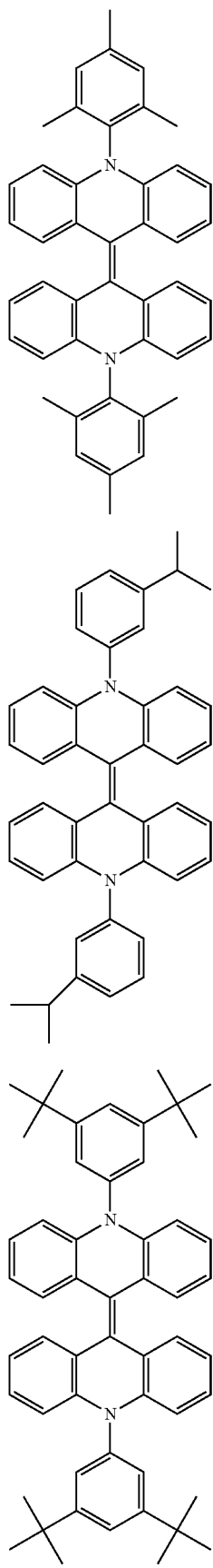
A-6
A-7
A-8
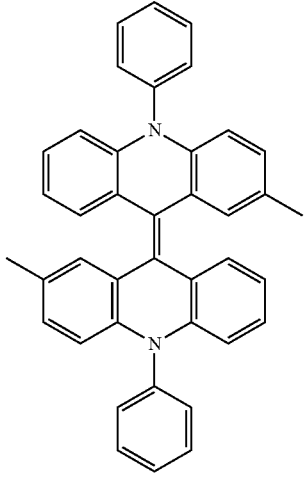
A-9
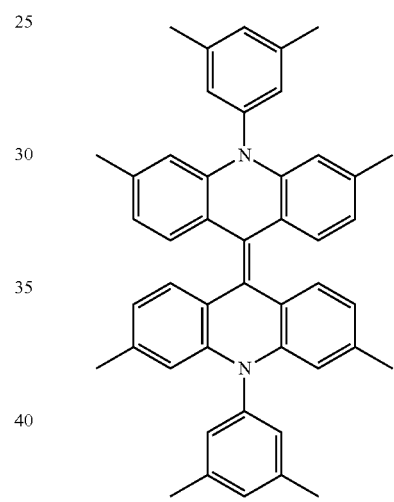
A-10
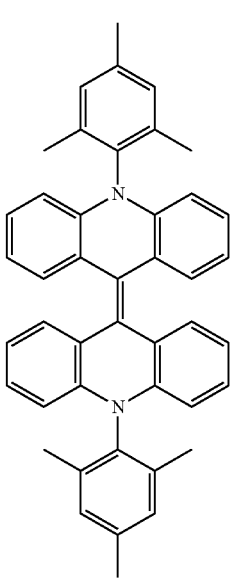

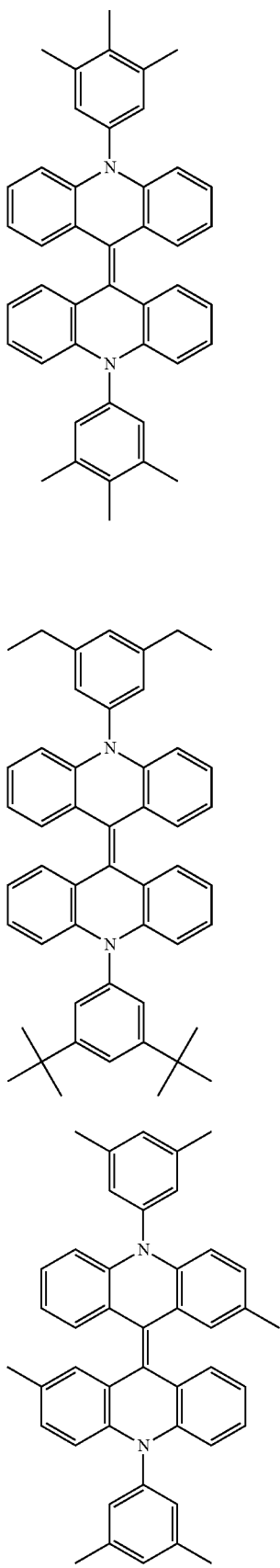
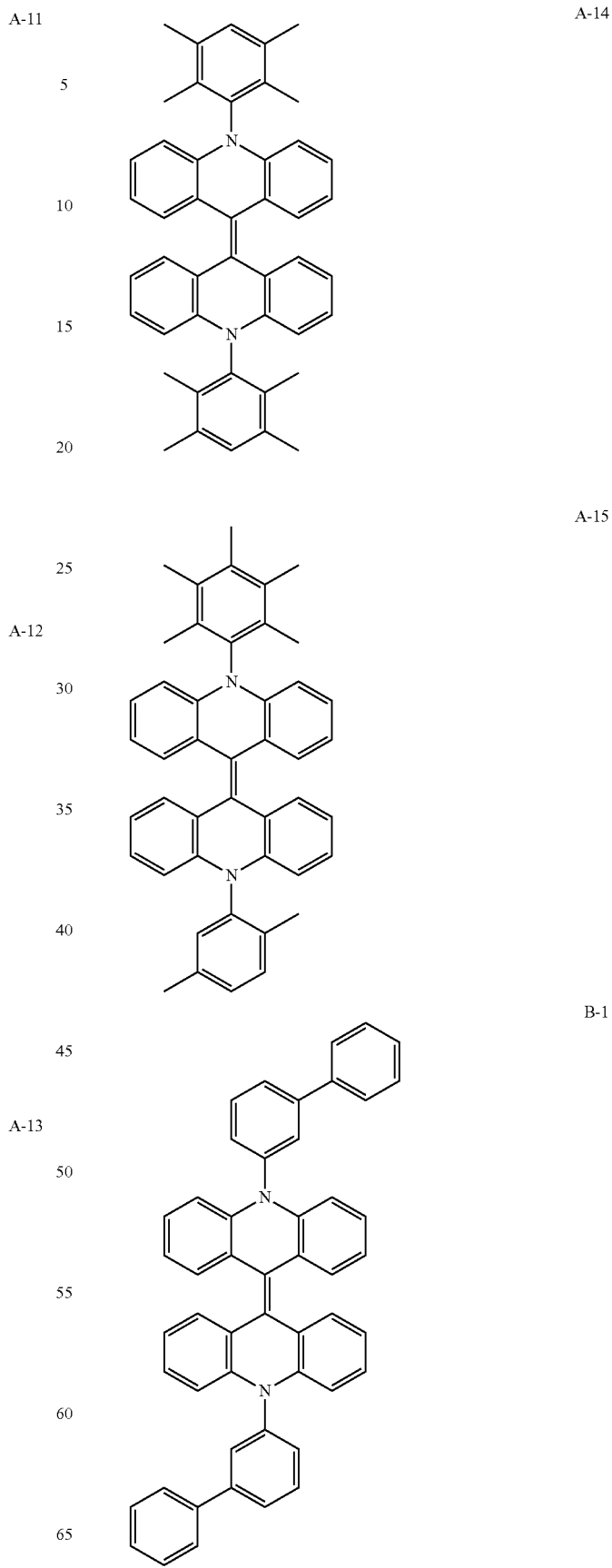

B-2 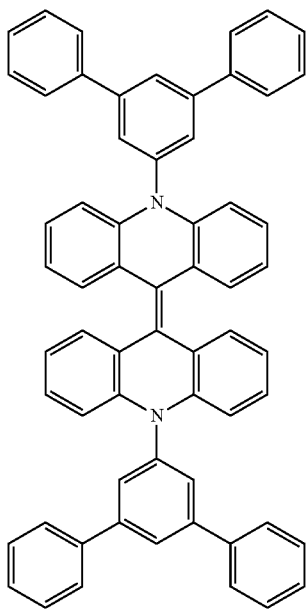
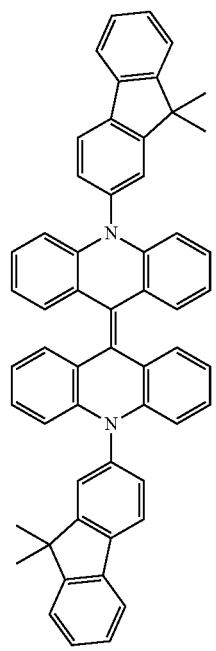  B-4
B-3 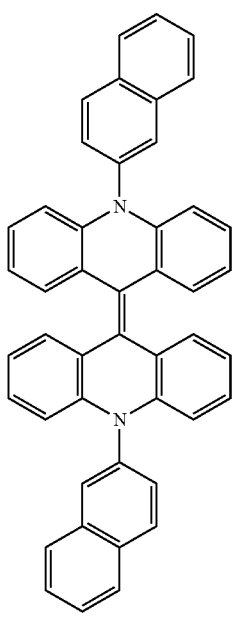
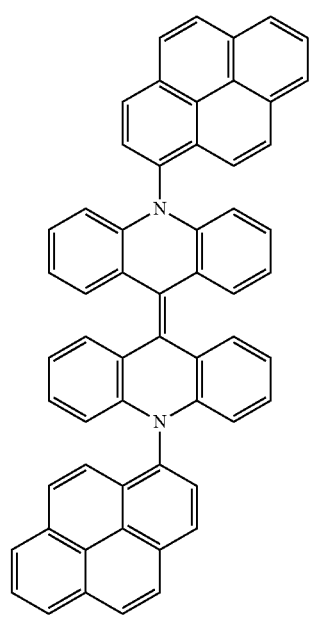  B-5

B-6
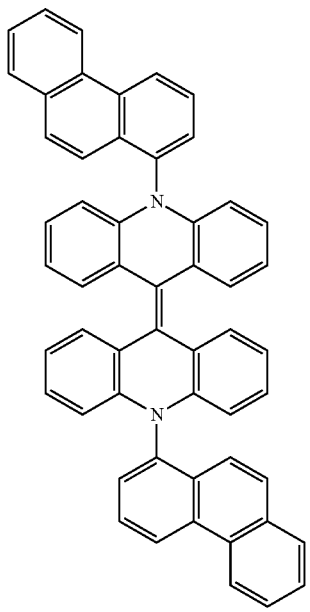
B-7
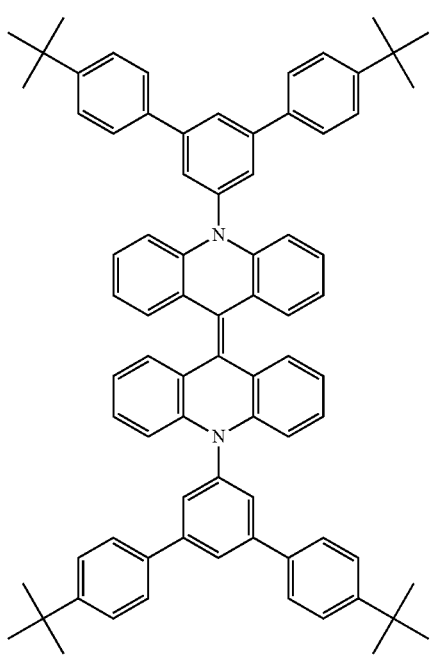
B-8
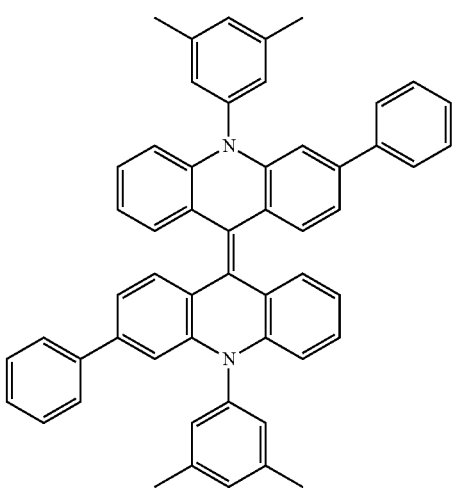
B-9
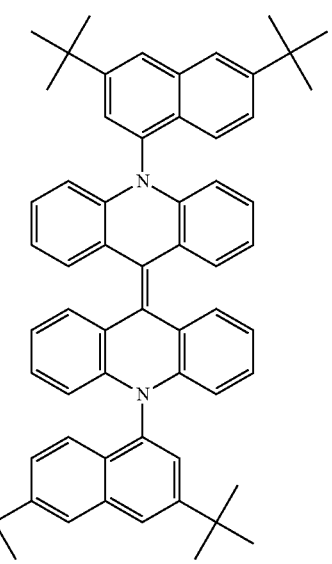
C-1
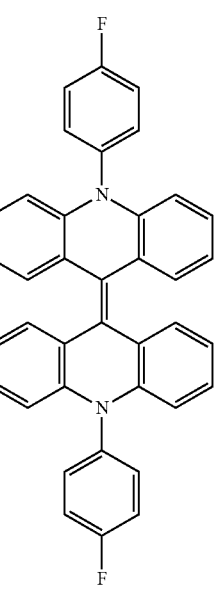

C-2
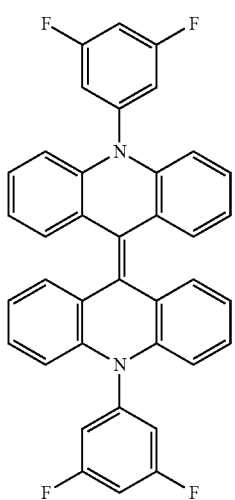
C-3
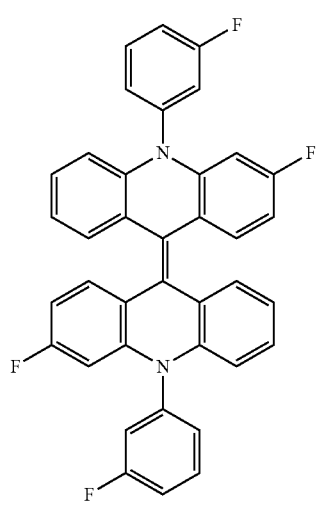
C-4
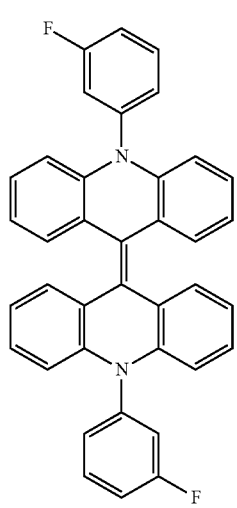
C-5
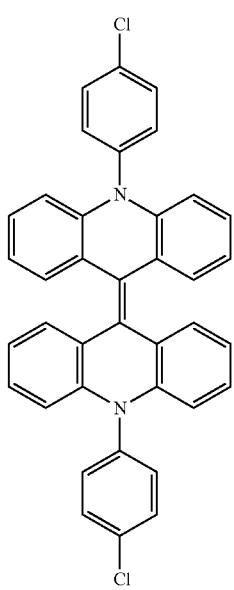
C-6
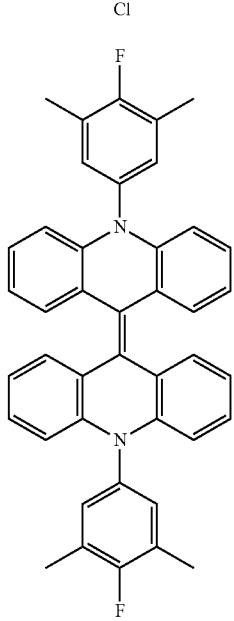
C-7
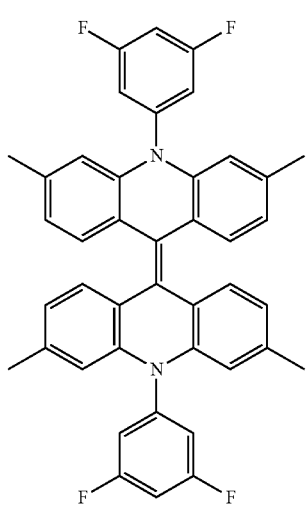

-continued

C-8
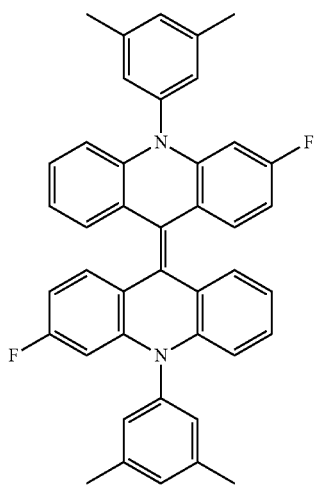

C-9
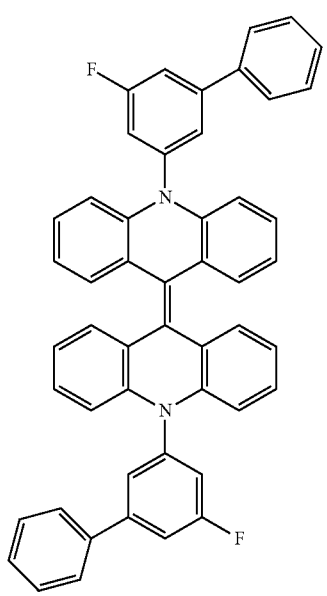

-continued

C-10
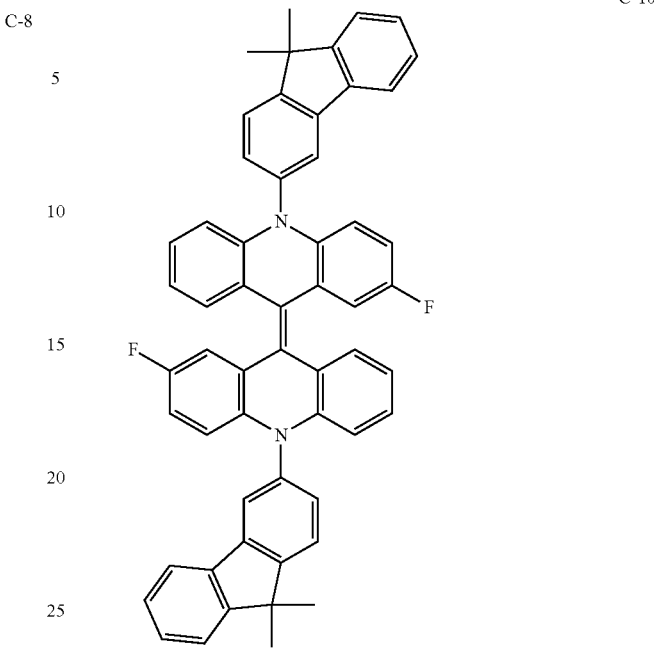

Here, Exemplified Compound A-1 is a compound in which $X_1$ and $X_2$ in the general formula [1] each represent a phenyl group. Exemplified Compounds A-2 to A-8 are each a compound obtained by substituting any one of the plurality of benzene rings in Exemplified Compound A-1 with an alkyl group, and its electron injection property can easily improve by virtue of the electron-donating property of the alkyl group. In addition, the sublimation temperature of the compound is decreased by the introduction of the alkyl group, and hence a deposition temperature at the time of the production of the element can be decreased.

Exemplified Compounds B-1 to B-9 are each a compound in which $X_1$ and $X_2$ in the general formula [1] each represent a substituent larger than a phenyl group, specifically an aryl group containing two or more benzene rings. When $X_1$ and $X_2$ in the general formula [1] each represent the aryl group containing two or more benzene rings, the glass transition temperature of the compound becomes higher than that of Exemplified Compound A-1 and hence the amorphous property of a film at the time of its formation improves. Accordingly, a stable amorphous film can be easily maintained over a long time period. In addition, the introduction of the aryl group containing two or more benzene rings improves the hydrophobicity of the compound itself and hence improves its water resistance. It is to be noted that Exemplified Compounds B-4 and B-7 to B-9 are each a compound into which an alkyl group has been further introduced. The electron injection property of each of those compounds improves and its sublimation temperature decreased. Accordingly, the deposition temperature at the time of the production of the element can be decreased.

Exemplified Compounds C-1 to C-10 are each a compound containing a halogen atom in itself. The stability and durability of the compound against oxidation improve by virtue of the electron-withdrawing property of the halogen atom itself. Particularly in the case of a compound containing a fluorine atom in itself, the water repellency of the compound improves and hence its water resistance improves. In addition, the incorporation of the fluorine atom into the compound reduces the sublimation temperature of the compound itself, and hence can reduce the deposition temperature at the time of the production of the element.

[Electron Accepting Compound]

When the organic functional layer constituting the organic light emitting element of the present invention and containing the organic compound represented by the general formula [1] is the electron injection layer, i.e., the layer in contact with the cathode, the electron injection layer may be a layer containing at least two kinds of organic compounds. Specifically, the layer may be a layer containing a first organic compound and a second organic compound. It is to be noted that the term "first organic compound" as used herein refers to the organic compound represented by the general formula [1], and the term "second organic compound" as used herein refers to an organic compound of a kind different from that of the organic compound represented by the general formula [1]. In addition, the phrase "of a kind different from" as used herein mainly refers to an organic compound whose basic skeleton is different from that of the organic compound represented by the general formula [1].

In addition, in the present invention, a layer that is adjacent to the organic functional layer containing the organic compound represented by the general formula [1] on the emission layer side, and that contains an organic compound of a kind different from that of the organic compound represented by the general formula [1] may be further arranged.

Here, the organic compound of a kind different from that of the organic compound represented by the general formula [1] to be incorporated into the organic functional layer or the layer adjacent to the organic functional layer is, for example, an electron accepting compound. In addition, when the electron injection layer is a layer containing the compound represented by the general formula [1] and the electron accepting compound, a mixing ratio between both the compounds is not particularly limited.

A compound having a skeleton or substituent having an electron-withdrawing characteristic is preferably used as an electron injection material serving as the electron accepting compound. For example, an electron accepting compound represented by any one of the following general formulae [2-1] to [2-8], [3-1] to [3-6], and [4-1] to [4-10] is preferably used.

General formula [2-1]

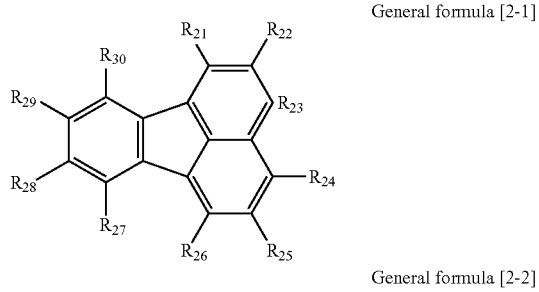

General formula [2-2]

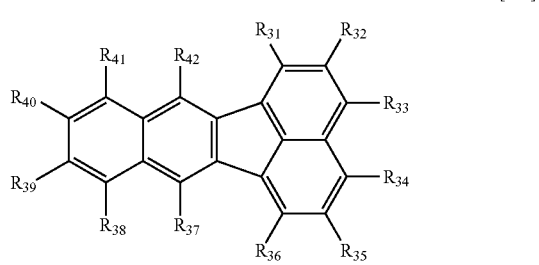

General formula [2-3]

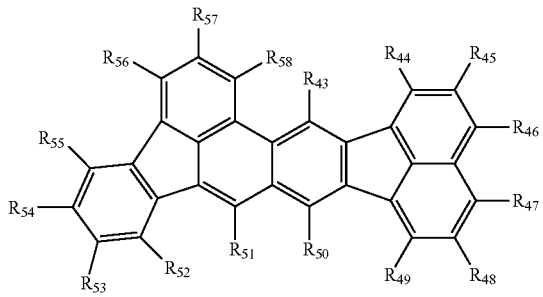

General formula [2-4]

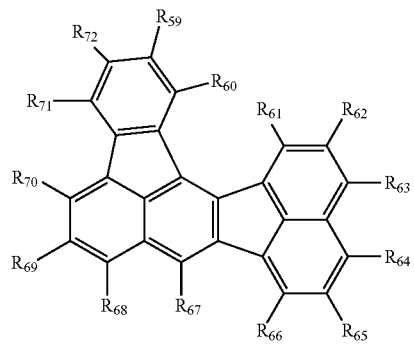

General formula [2-5]

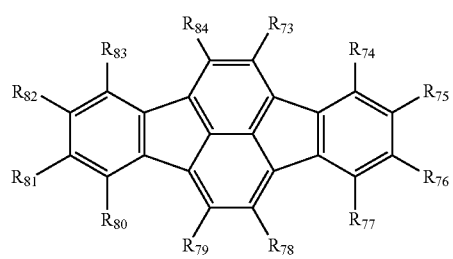

General formula [2-6]

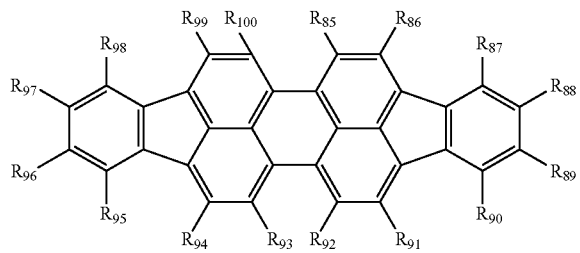

General formula [2-7]

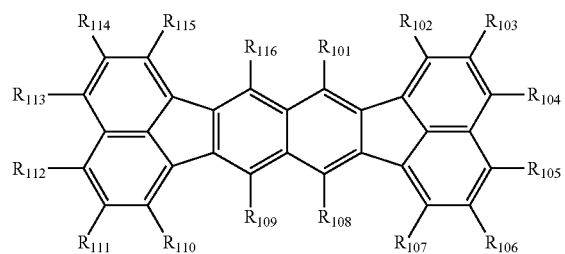

General formula [2-8]
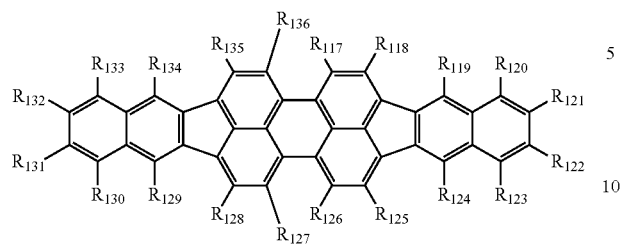
General formula [3-1]
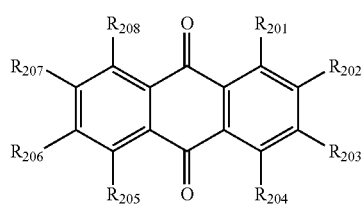
General formula [3-2]
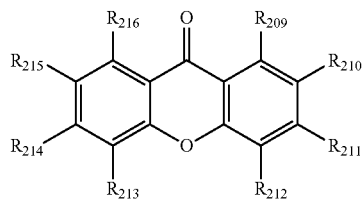
General formula [3-3]
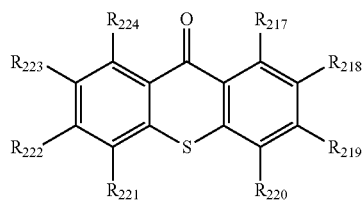
General formula [3-4]
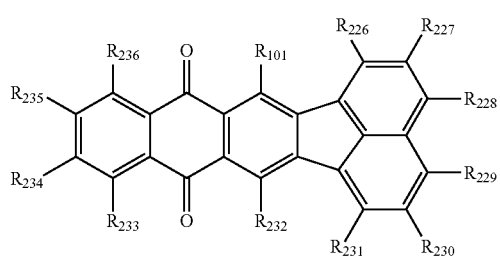
General formula [3-5]
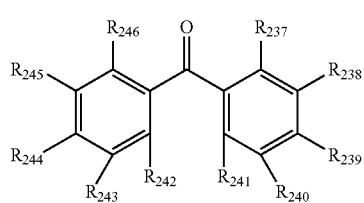
General formula [3-6]
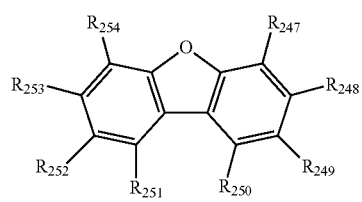
General formula [4-1]
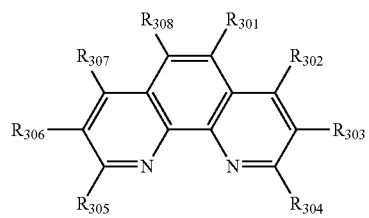
General formula [4-2]
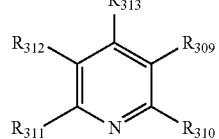
General formula [4-3]
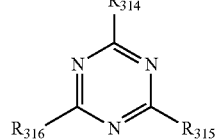
General formula [4-4]
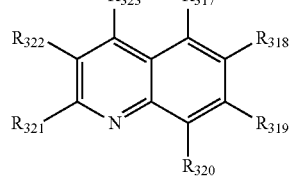
General formula [4-5]
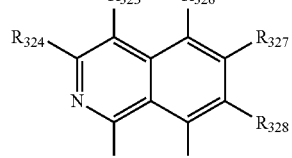
General formula [4-6]
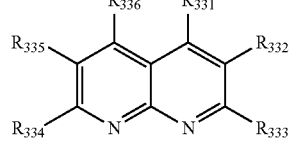
General formula [4-7]
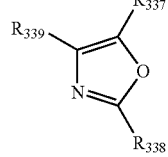

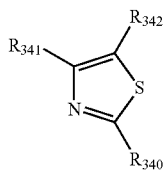
General formula [4-8]

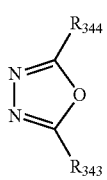
General formula [4-9]

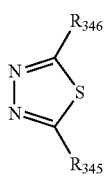
General formula [4-10]

In the general formulae [2-1] to [2-8], [3-1] to [3-6], and [4-1] to [4-10], $R_{21}$ to $R_{136}$, $R_{201}$ to $R_{254}$, and $R_{301}$ to $R_{346}$ each represent a substituent selected from a hydrogen atom, a substituted or unsubstituted alkyl group, a substituted or unsubstituted alkoxy group, a substituted or unsubstituted aryl group, a substituted or unsubstituted heteroaryl group, a halogen atom, a cyano group, a substituted or unsubstituted amino group, and a nitro group.

The substituents may be identical to or different from each other, and adjacent substituents may be bonded to each other to form a ring.

Examples of the alkyl group represented by any one of $R_{21}$ to $R_{136}$, $R_{201}$ to $R_{254}$, and $R_{301}$ to $R_{346}$ include a methyl group, an ethyl group, an isopropyl group, a n-propyl group, a s-butyl group, a t-butyl group, a n-pentyl group, a cyclohexyl group, and an adamantyl group.

Examples of the alkoxy group represented by any one of $R_{21}$ to $R_{136}$, $R_{201}$ to $R_{254}$, and $R_{301}$ to $R_{346}$ include a methoxyl group, an ethoxyl group, propoxyl group, and a phenoxyl group.

Examples of the aryl group represented by any one of $R_{21}$ to $R_{136}$, $R_{201}$ to $R_{254}$, and $R_{301}$ to $R_{346}$ include a phenyl group, a naphthyl group, a pentalenyl group, an indenyl group, an azulenyl group, an anthryl group, a pyrenyl group, an indacenyl group, an acenaphthenyl group, a phenanthryl group, a phenalenyl group, a fluoranthenyl group, an acephenanthryl group, an aceanthryl group, a triphenylenyl group, a chrysenyl group, a naphthacenyl group, a perylenyl group, a pentacenyl group, a biphenyl group, a terphenyl group, and a fluorenyl group.

Examples of the heteroaryl group represented by any one of $R_{21}$ to $R_{136}$, $R_{201}$ to $R_{254}$, and $R_{301}$ to $R_{346}$ include a pyridinyl group, a pyrimidinyl group, a triazinyl group, a thienyl group, a furyl group, a pyrrolyl group, an imidazolyl group, and a triazolyl group.

Examples of the halogen atom represented by any one of $R_{21}$ to $R_{136}$, $R_{201}$ to $R_{254}$, and $R^{301}$ to $R_{346}$ include a fluorine atom, a chlorine atom, a bromine atom, and an iodine atom.

Examples of the amino group represented by any one of $R_{21}$ to $R_{136}$, $R_{201}$ to $R_{254}$, and $R_{301}$ to $R_{346}$ include a dimethylamino group, a diethylamino group, a dibenzylamino group, a diphenylamino group, a ditolylamino group, a di-t-butylamino group, a dianisolylamino group, and a carbazoyl group.

As a substituent that the alkyl group, the alkoxy group, the aryl group, the heteroaryl group, and the amino group may each have, there are given, for example: alkyl groups, such as a methyl group, an ethyl group, and a propyl group; aryl groups, such as a phenyl group, a biphenyl group, a naphthyl group, a pyrenyl group, an anthryl group, and a fluorenyl group; heteroaryl groups, such as a thienyl group, a pyrrolyl group, and a pyridyl group; amino groups, such as a dimethylamino group, a diethylamino group, a dibenzylamino group, a diphenylamino group, a ditolylamino group, and a dianisolylamino group; alkoxyl groups, such as a methoxyl group, an ethoxyl group, a propoxyl group, and a phenoxyl group; a cyano group; a nitro group; and halogen atoms, such as a fluorine atom and a chlorine atom.

Of the listed electron accepting compounds, a compound whose mother skeleton is formed only of a hydrocarbon like the compounds represented by the general formulae [2-1] to [2-8] is preferred because the compound has a high carrier mobility and hence reduces the drive voltage of the organic light emitting element.

Specific examples of the electron accepting compound are listed below. However, the present invention is of course not limited to these compounds.

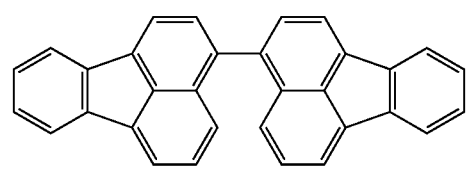
EI1

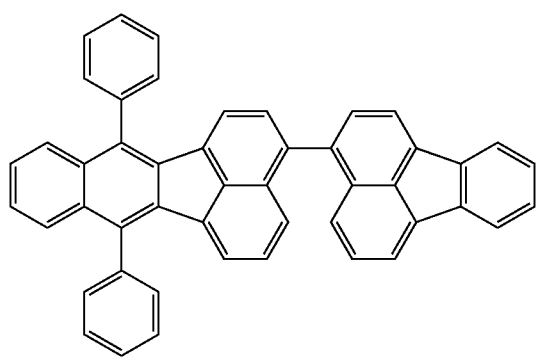
EI2

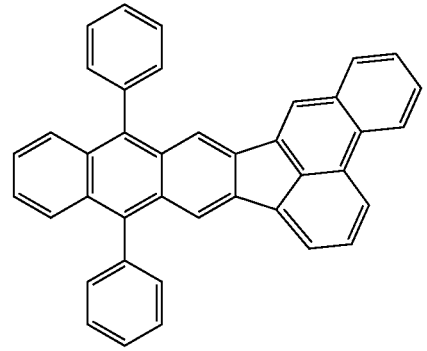
EI3

EI4
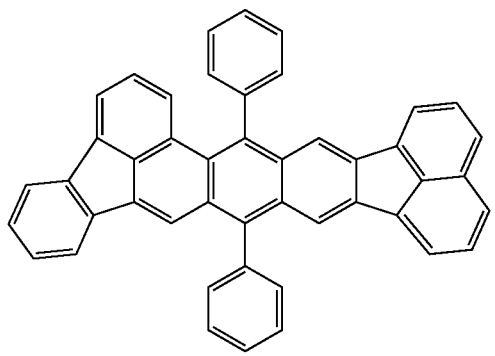
EI5
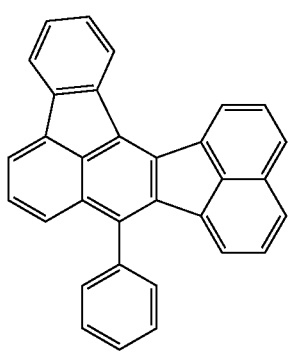
EI6
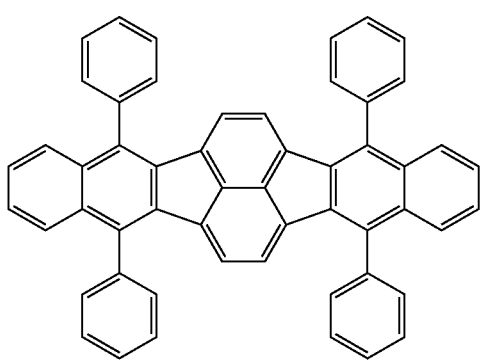
EI7
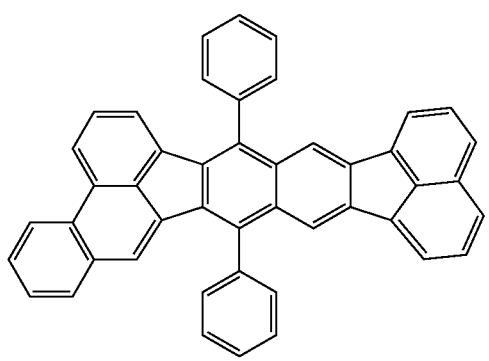
EI8
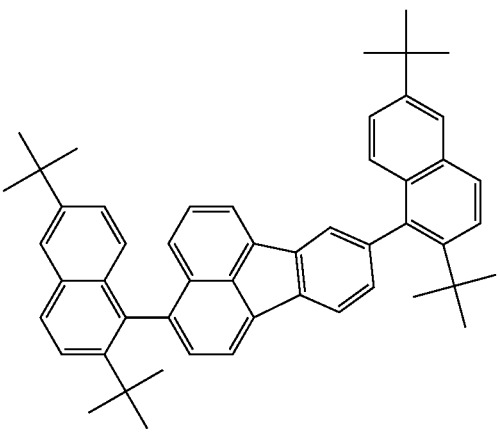
EI9
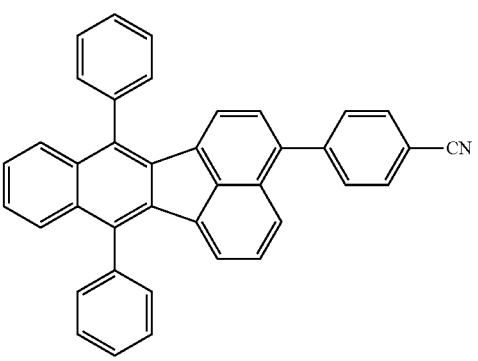
EI10
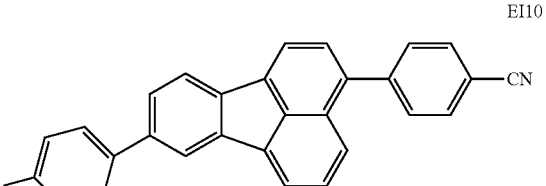
EI11
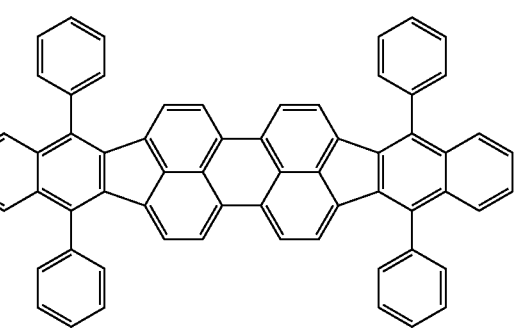

EI12
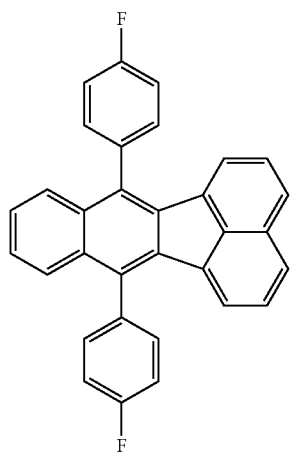

EI13
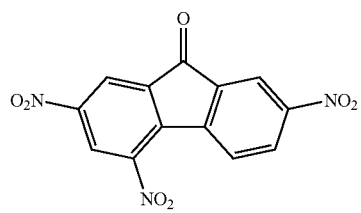

EI14
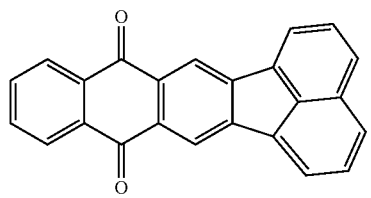

EI15
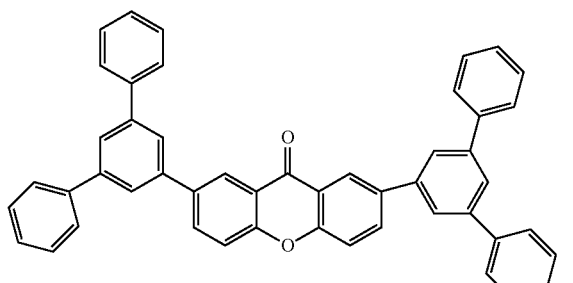

EI16
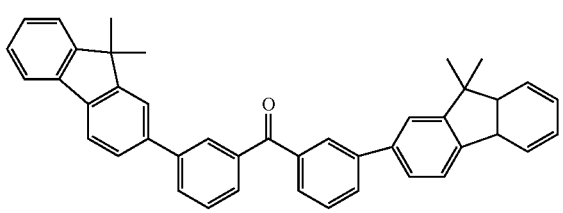

EI17
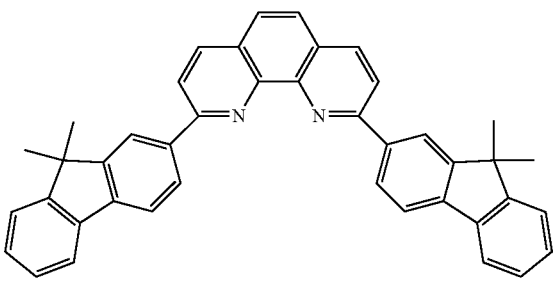

EI18
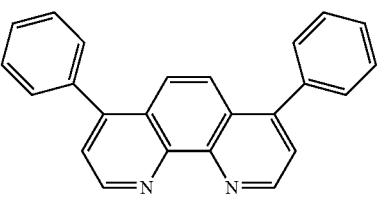

EI19
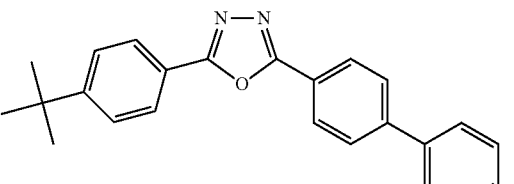

EI20
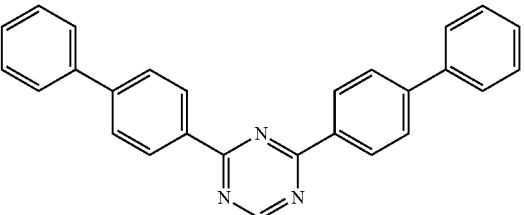

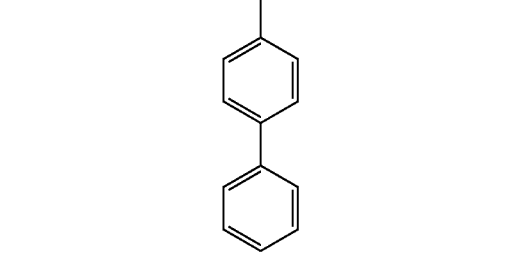

[Other Constituent Material for Organic Light Emitting Element]

In the organic light emitting element of the present invention, in addition to the compound represented by the general formula [1] and the electron accepting compound described above, a known compound can be used as a constituent material to be incorporated into the element. Examples of such compound are given below.

In the present invention, a constituent material for the electron transport layer or the hole blocking layer can be arbitrarily selected from materials that can transport an electron injected from the cathode to the emission layer, and the material is selected in consideration of, for example, the balance with the hole mobility of a hole-transporting material. Examples of the material having electron transport performance include an oxadiazole derivative, an oxazole derivative, a pyrazine derivative, a triazole derivative, a triazine derivative, a quinoline derivative, a quinoxaline derivative, a phenanthroline derivative, an organic aluminum complex, and condensed ring compounds (such as a fluorene derivative, a naphthalene derivative, a chrysene derivative, an anthracene derivative, a fluoranthene derivative, a benzofluoranthene derivative, and a perylene derivative). It is to be noted that the electron-transporting compound is also suitably used as a constituent material for the hole blocking layer, and hence the electron-transporting compound may be used to form each of the electron transport layer and the hole blocking layer.

Specific examples of a compound to be used as the electron-transporting compound are shown below. However, the compound is of course not limited thereto.

ET1
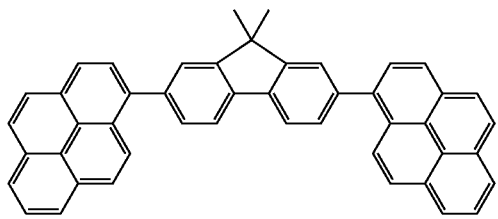

ET2
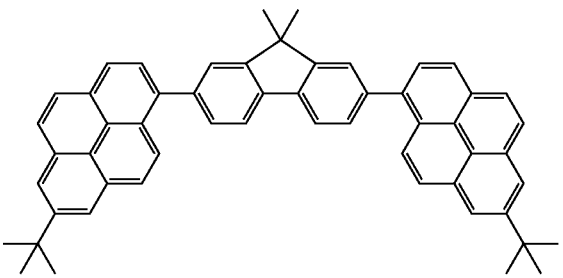

ET3
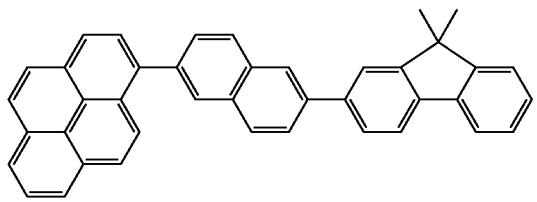

ET4
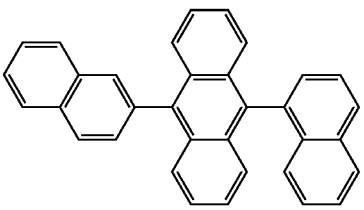

ET5
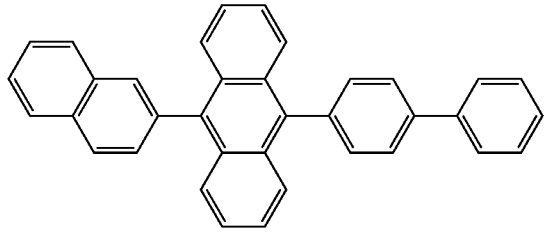

ET6
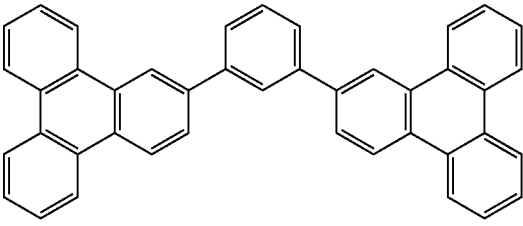

ET7
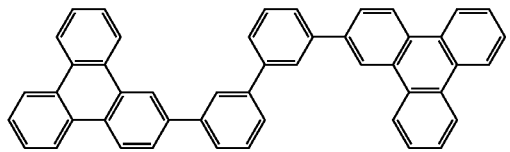

ET8
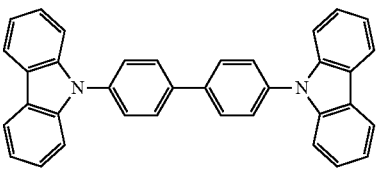

ET9
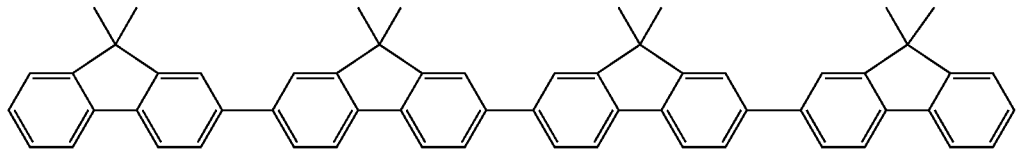

ET10
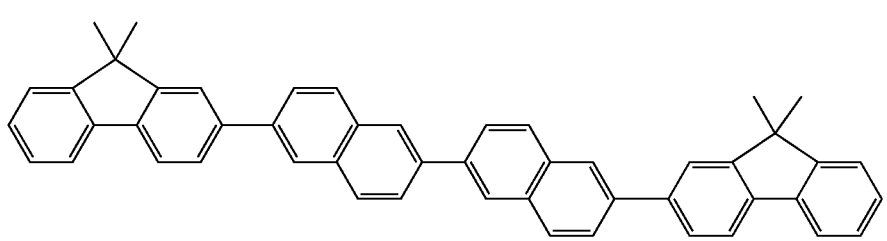

-continued
ET11
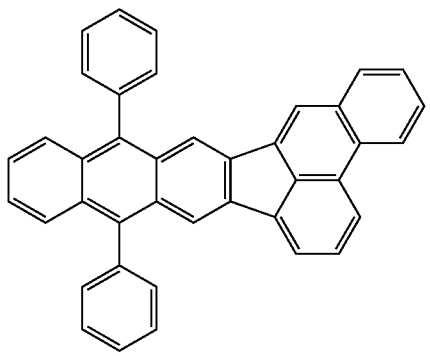
ET12
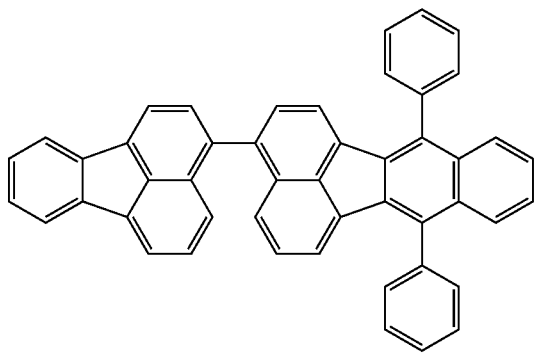
ET13
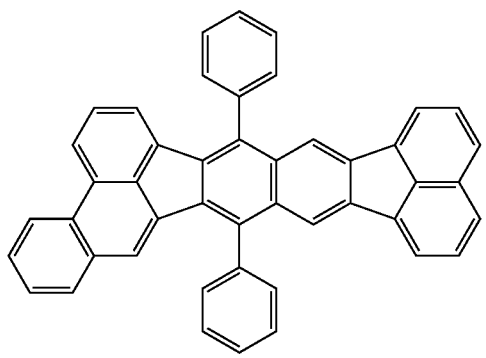
ET14
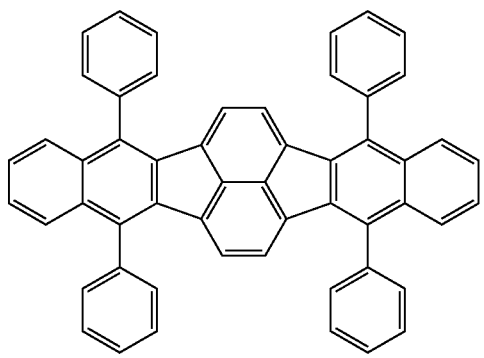
ET15
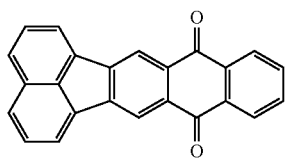
ET16
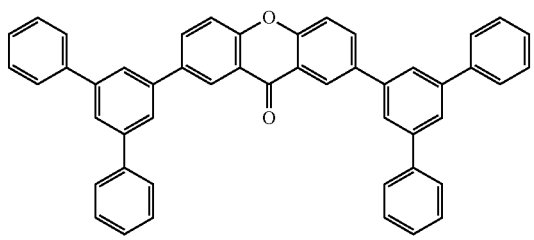
ET17
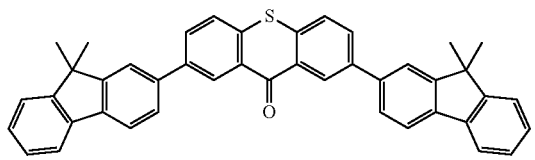
ET18
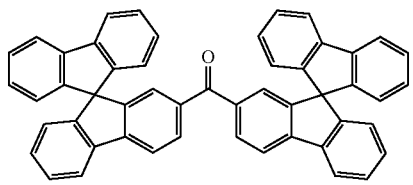
ET19
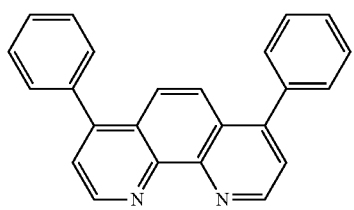
ET20
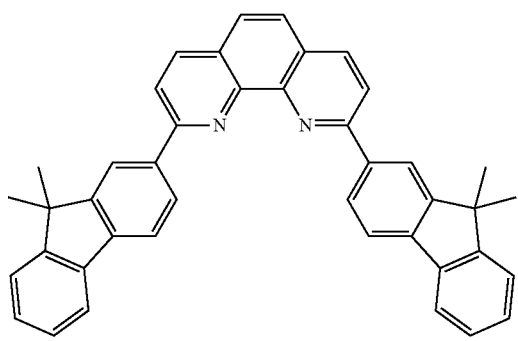

-continued

ET21
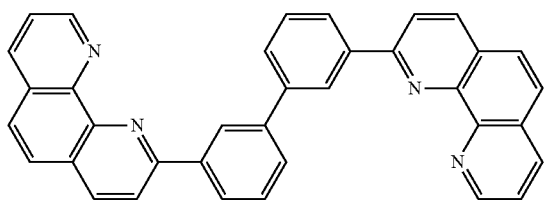

ET22
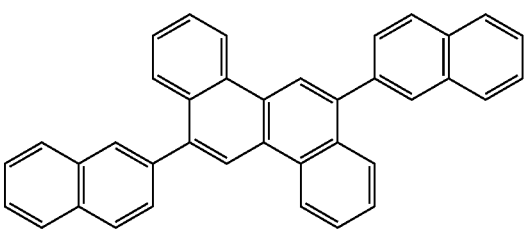

ET23
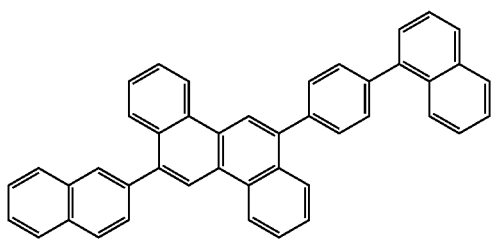

ET24
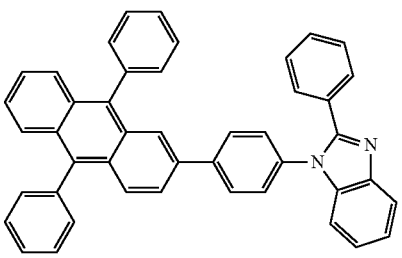

ET25
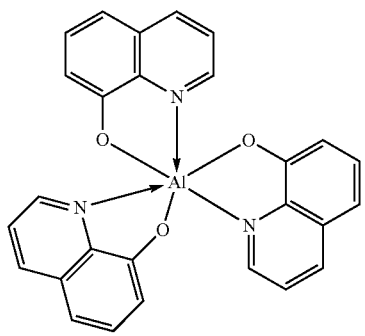

ET26
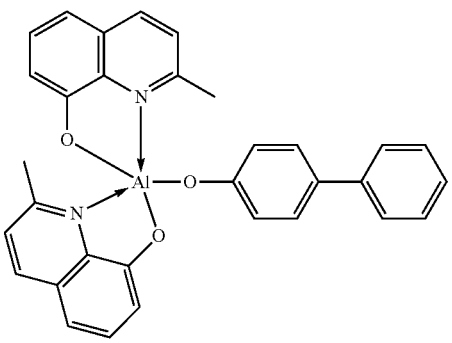

ET27
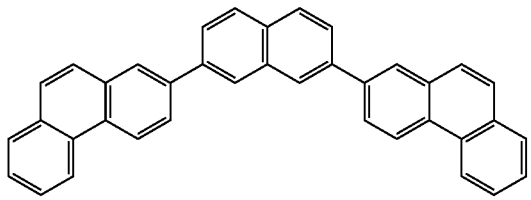

ET28
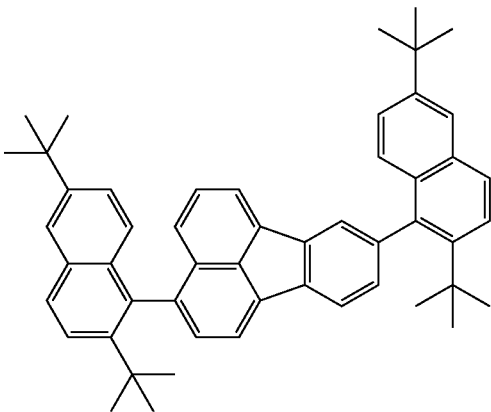

A hole-injecting/transporting material is preferably a material having a high hole mobility so that the injection of holes from the anode may be facilitated and the injected holes can be transported to the emission layer. In addition, the material is preferably a material having a high glass transition temperature for preventing the degradation of film quality, such as crystallization, in the organic light emitting element. As low-molecular and high-molecular materials each having hole injection/transport performance, there are given, for example, a triarylamine derivative, an arylcarbazole derivative, a phenylenediamine derivative, a stilbene derivative, a phthalocyanine derivative, a porphyrin derivative, poly(vinyl carbazole), poly(thiophene), and other conductive polymers. Further, the hole-injecting/transporting material is suitably used for an electron blocking layer as well.

Specific examples of a compound to be used as the hole-injecting/transporting material are shown below. However, the compound is of course not limited thereto.

HT1
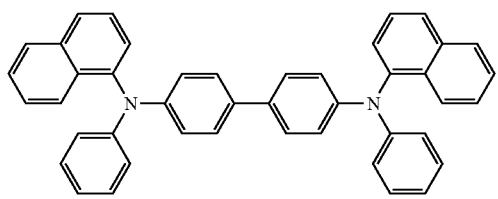
HT2
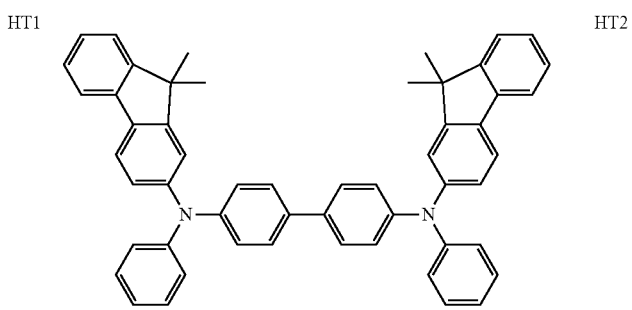
HT3
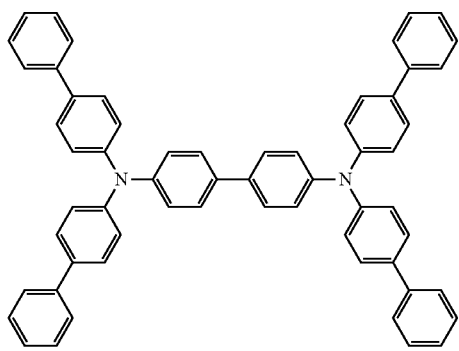
HT4
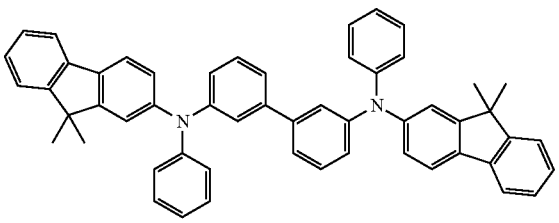
HT5
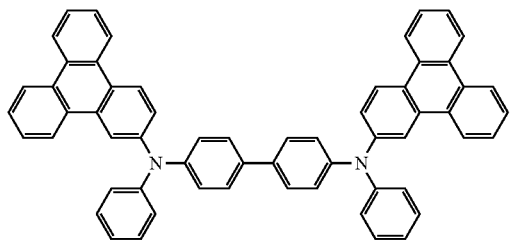
HT6
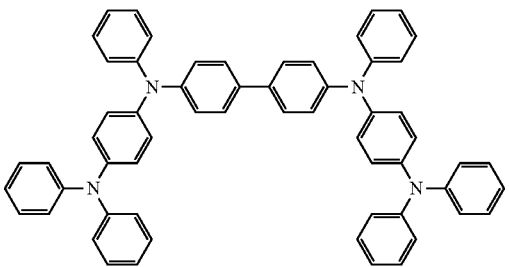
HT7
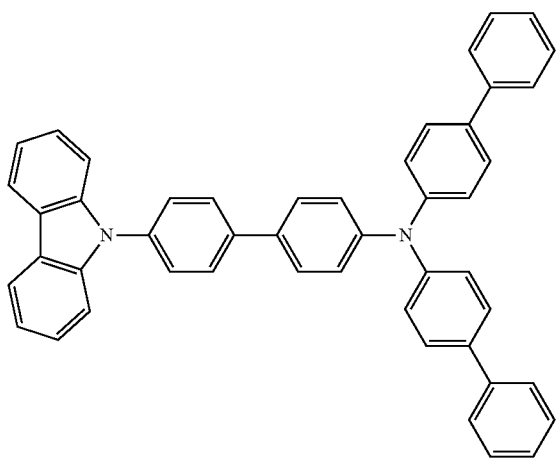

-continued
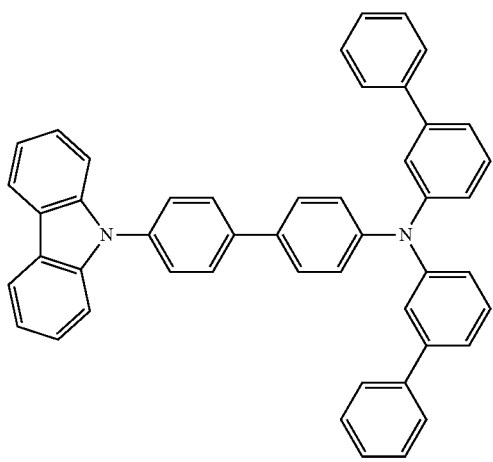
HT9
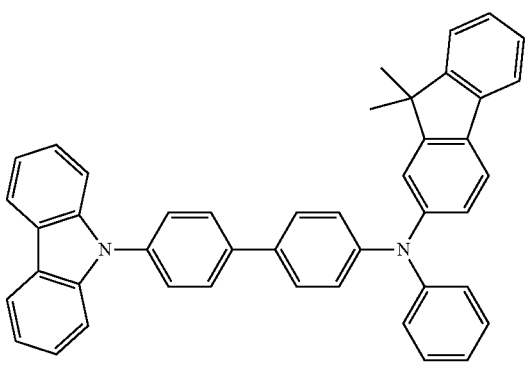
HT10
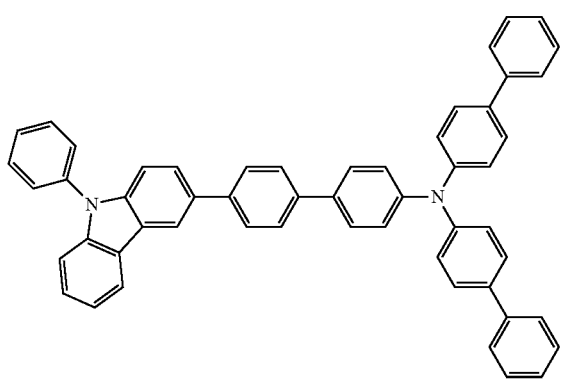
HT11
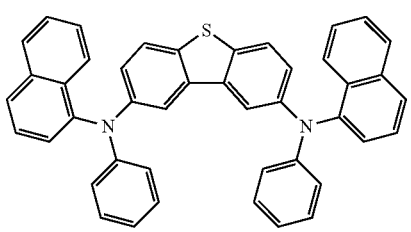
HT12
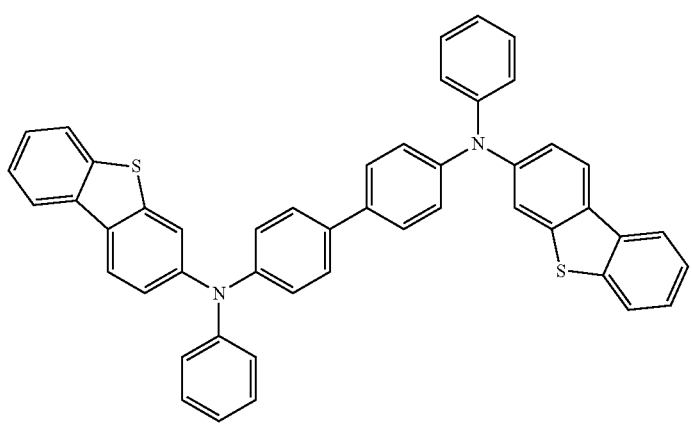
HT13

HT14

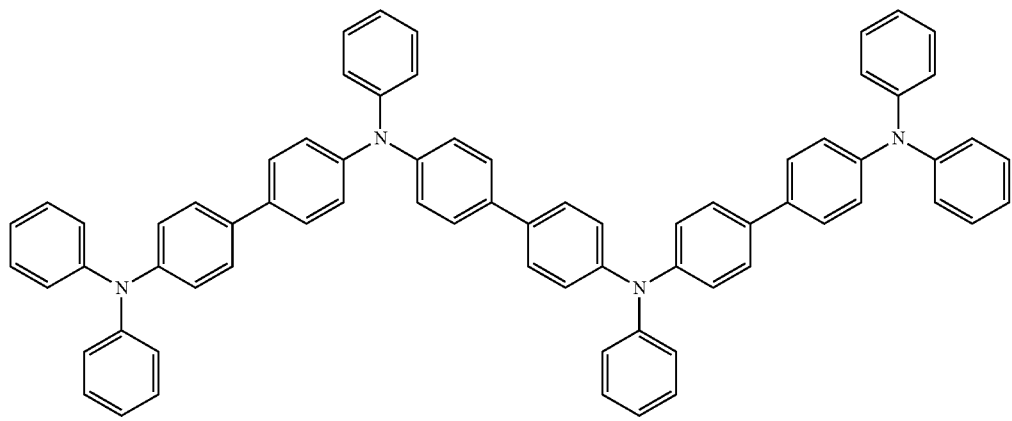

As a light-emitting material mainly involved in an emission function, there are given, for example: condensed ring compounds (such as a fluorene derivative, a naphthalene derivative, a pyrene derivative, a perylene derivative, a tetracene derivative, an anthracene derivative, and rubrene); a quinacridone derivative; a coumarin derivative; a stilbene derivative; an organic aluminum complex, such as tris(8-quinolinolato)aluminum; an iridium complex; a platinum complex; a rhenium complex; a copper complex; a europium complex; a ruthenium complex; and polymer derivatives, such as a poly(phenylene vinylene) derivative, a poly(fluorene) derivative, and a poly(phenylene) derivative.

Specific examples of a compound to be used as the light-emitting material are shown below. However, the compound is of course not limited thereto.

BD1

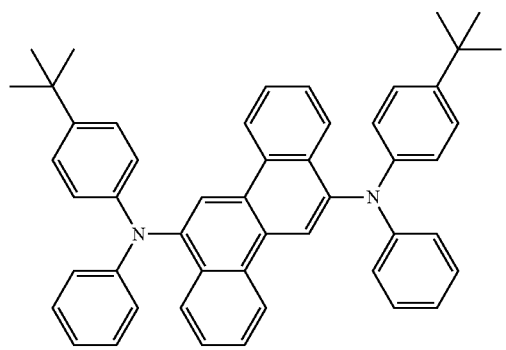

BD2

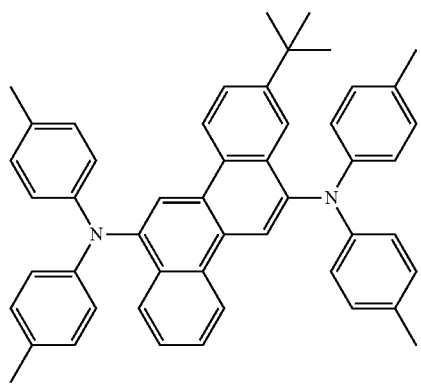

BD3

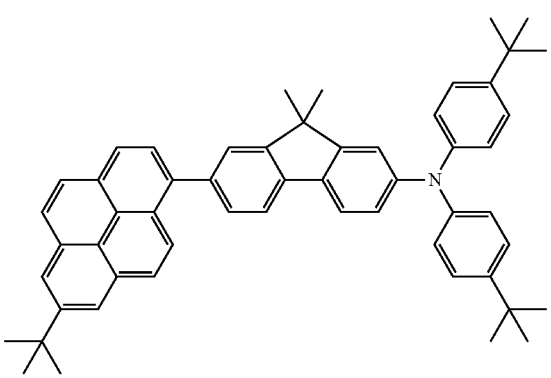

BD4

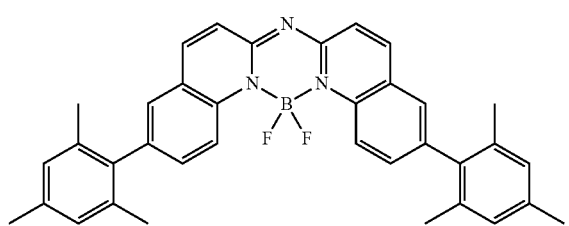

BD5

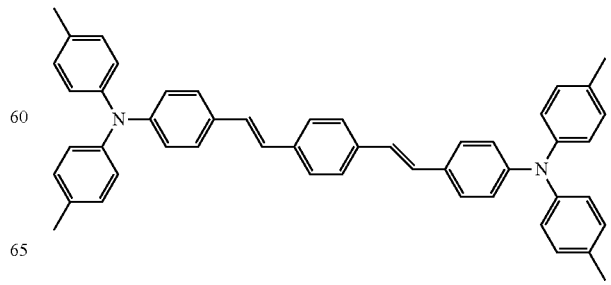

BD6 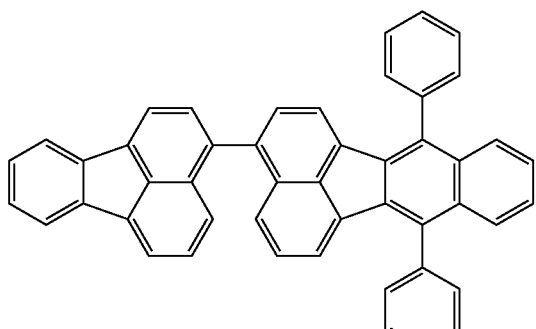
BD7 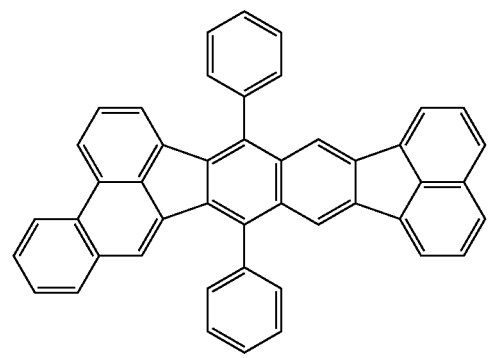
BD8 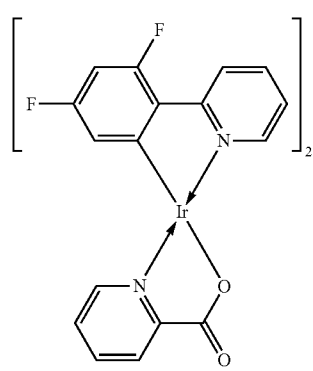
GD1 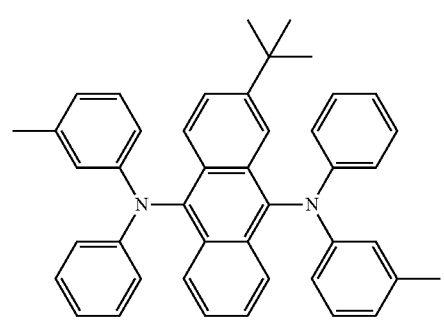
GD2 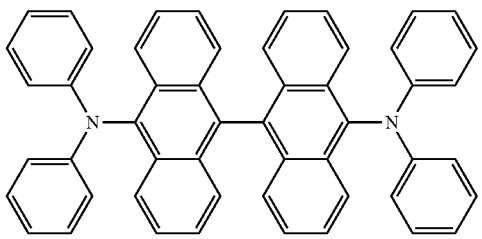
GD3 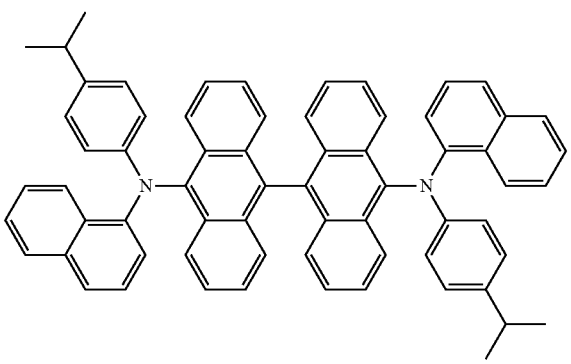
GD4 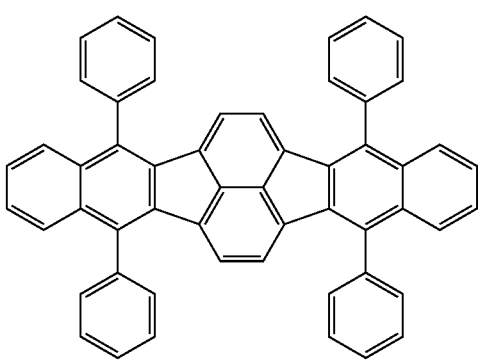
GD5 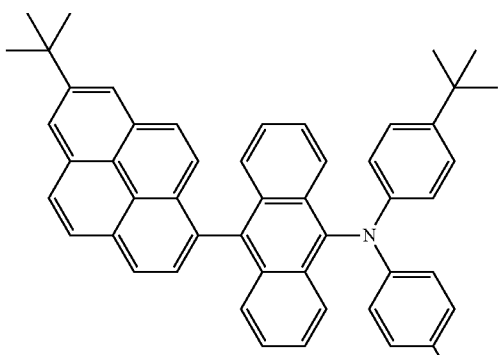
GD6 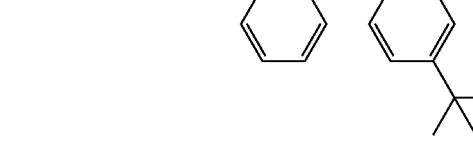

GD7
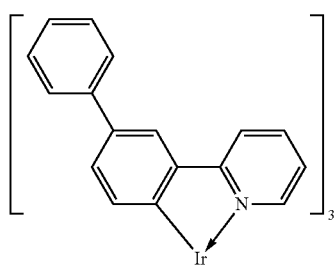
GD8
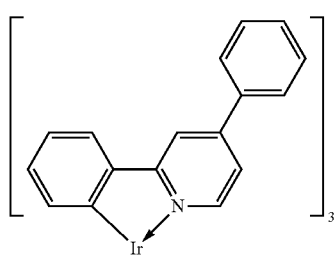
RD1
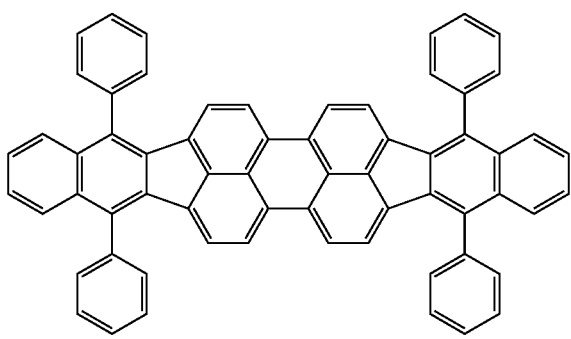
RD2
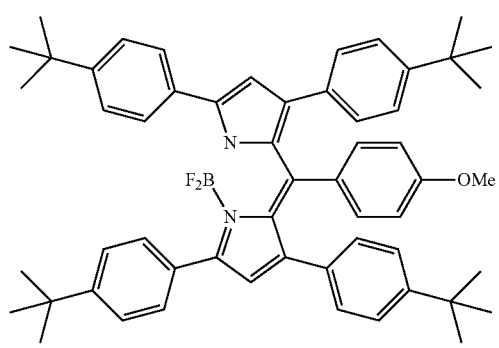
RD3
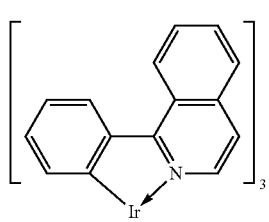
RD4
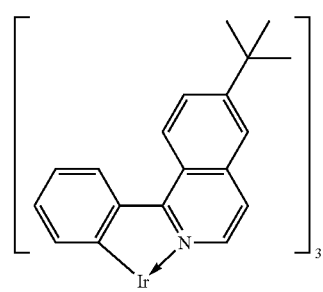
RD5
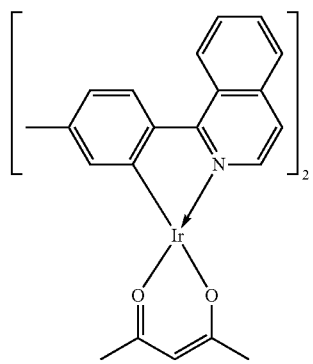
RD6
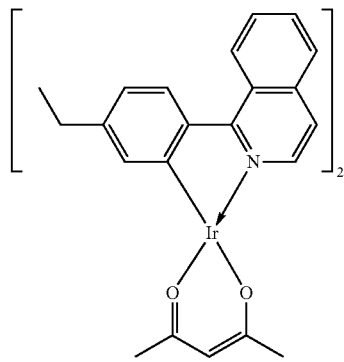
RD7
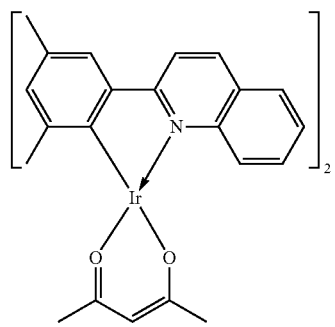

-continued

RD8

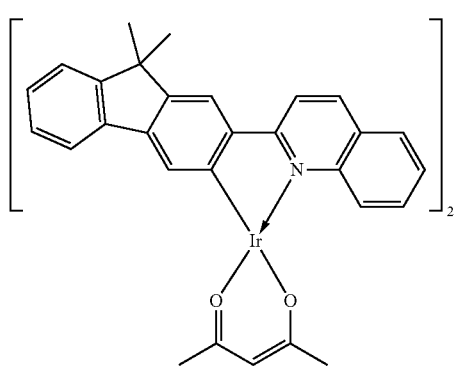

As an emission layer host or light emitting assist material to be incorporated into the emission layer, there are given, for example: an aromatic hydrocarbon compound or a derivative thereof; a carbazole derivative; a dibenzofuran derivative; a dibenzothiophene derivative; an organic aluminum complex, such as tris(8-quinolinolato)aluminum; and an organic beryllium complex.

Specific examples of a compound to be used as the emission layer host or light emitting assist material to be incorporated into the emission layer are shown below. However, the compound is of course not limited thereto.

EM1

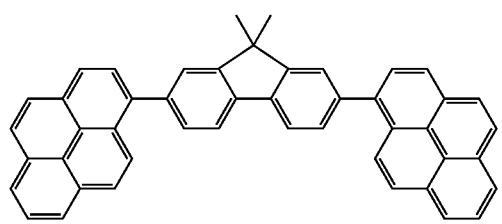

EM2

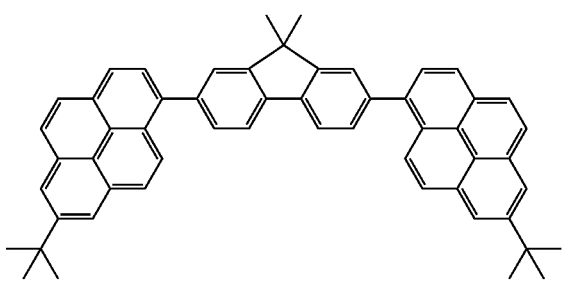

EM3

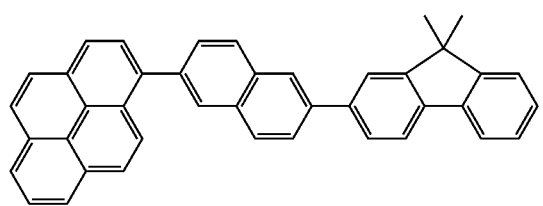

EM4

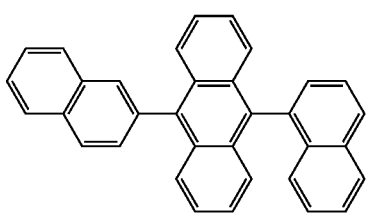

EM5

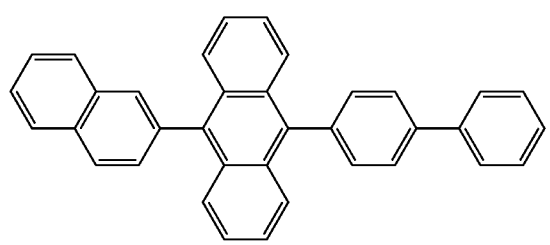

EM6

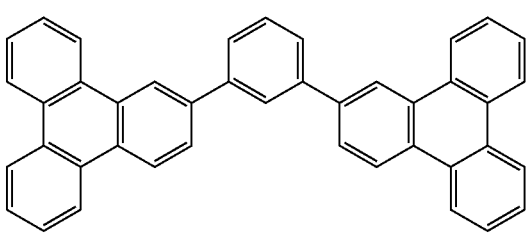

EM7

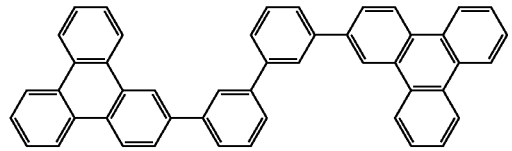

EM8

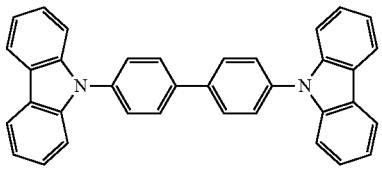

EM9

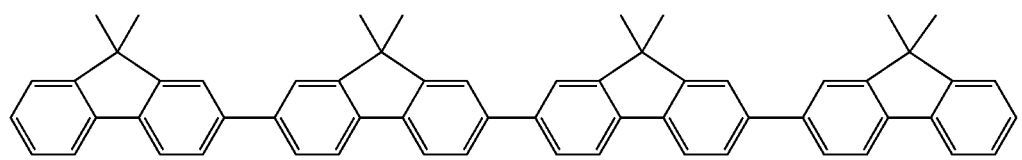

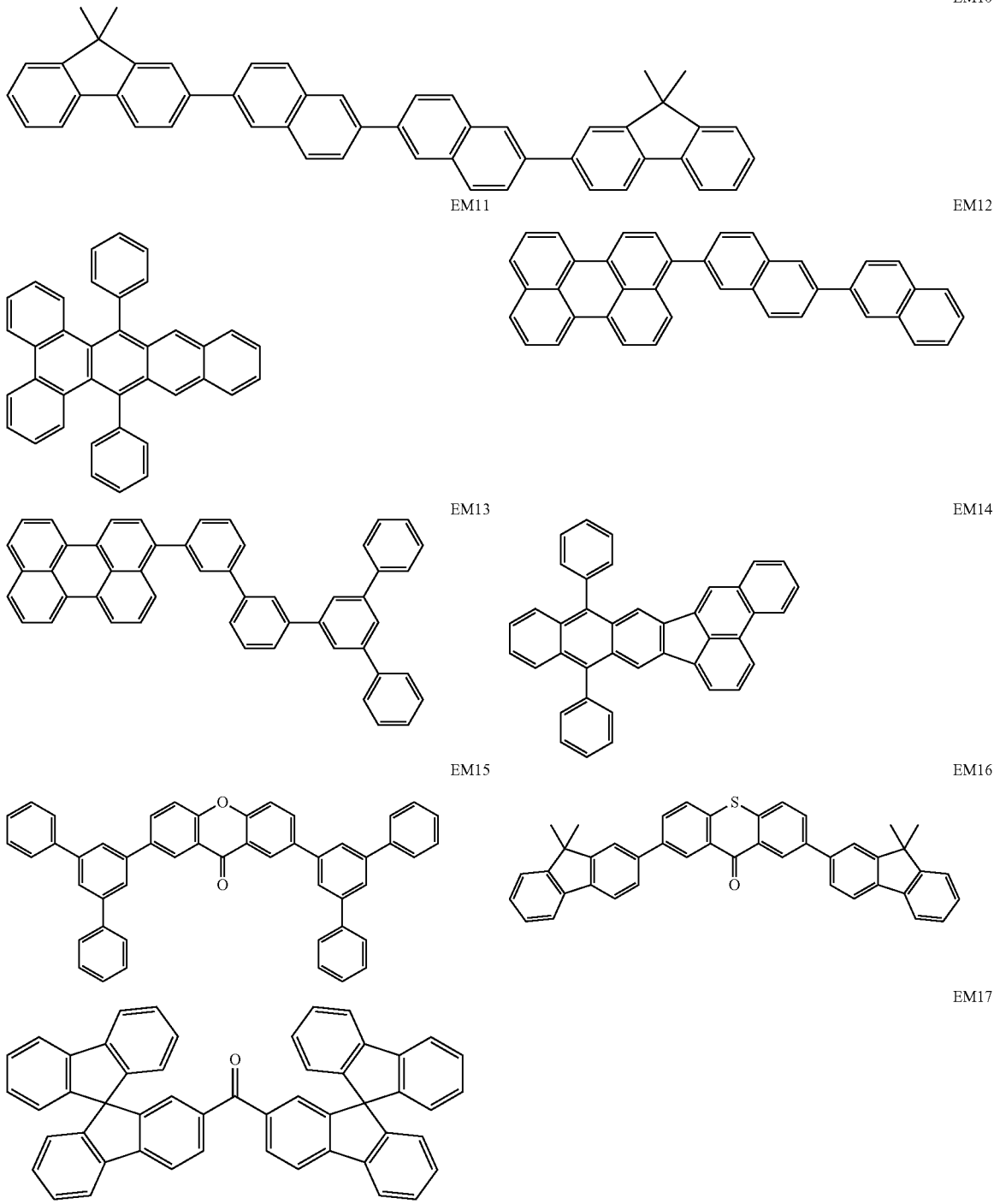

A constituent material for the anode desirably has as large a work function as possible. Examples thereof may include: elemental metal such as gold, platinum, silver, copper, nickel, palladium, cobalt, selenium, vanadium, and tungsten or alloys obtained by combining these elemental metals; metal oxides such as tin oxide, zinc oxide, indium oxide, indium tin oxide (ITO), and indium zinc oxide; and conductive polymers such as polyaniline, polypyrrole, and polythiophene.

One kind of those electrode substances may be used alone, or two or more kinds thereof may be used in combination. In addition, the anode may be of a single-layer construction or may be of a multilayer construction.

On the other hand, a constituent material for the cathode desirably has as small a work function as possible, but is not limited to such material. Examples thereof include: alkali metals such as lithium; alkaline earth metals such as calcium; and elemental metals such as aluminum, titanium, manganese, silver, lead, chromium, and gold. Alternatively, alloys obtained by combining those elemental metals can be used. For example, a magnesium-silver alloy, an aluminum-lithium alloy, or an aluminum-magnesium alloy can be used. A metal oxide such as indium tin oxide (ITO) can also be utilized. One kind of those electrode substances may be used alone, or two or more kinds thereof may be used in combination. In addition, the cathode may be of a single-layer construction or may be of a multilayer construction.

In the present invention, with regard to the light extraction direction of the organic light emitting element, a bottom emission constitution (constitution in which light is extracted from a substrate side) may be adopted or a top emission construction (construction in which light is extracted from a side opposite to the substrate) may be adopted. In the case of the bottom emission constitution, while a first electrode, which is the electrode closer to the substrate side, is a light transmissive electrode or a light semi-transmissive electrode, a second electrode on the side opposite to the substrate is a light reflective electrode. On the other hand, in the case of the top emission constitution, while the first electrode, which is the electrode closer to the substrate side, is the light reflective electrode, the second electrode on the side opposite to the substrate is the light transmissive electrode or light semi-transmissive electrode. A metal conductive layer having a large thickness (of 80 nm or more and 600 nm or less) can be used as the light reflective electrode. In addition, a metal conductive layer having a small thickness of from 15 nm to 35 nm can be used as the light semi-transmissive electrode.

The organic light emitting element of the present invention is preferably encapsulated in order that the contact of oxygen, moisture, or the like may be suppressed. A method of encapsulating the organic light emitting element of the present invention is, for example, a method involving forming an encapsulation layer on the organic light emitting element. Examples of a constituent material for the encapsulation layer for encapsulating the organic light emitting element include materials such as: inorganic oxides, inorganic nitrides, and inorganic oxynitrides, such as $SiO_2$, SiN, and SiON; polymer compounds, such as a fluorine resin, poly-p-xylene, polyethylene, a silicone resin, and a polystyrene resin; and photocurable resins. In addition, a member formed by an atomic layer deposition (ALD) method on the second electrode can be used as the encapsulation layer.

In addition, an organic film layer such as an optical interference layer can be formed on the second electrode.

The organic compound layer (such as the hole injection layer, the hole transport layer, the electron blocking layer, the emission layer, the hole blocking layer, the electron transport layer, the blocking layer, or the electron injection layer) constituting the organic light emitting element of the present invention is formed by the following method.

A dry process, such as a vacuum deposition method, an ionized vapor deposition method, sputtering, or a plasma process, can be used for the formation of the organic compound layer constituting the organic light emitting element of the present invention. In addition, a wet process involving dissolving the constituent materials in an appropriate solvent and forming a layer by a known application method (such as spin coating, dipping, a casting method, an LB method, or an ink jet method) can be used instead of the dry process.

Here, when the layer is formed by the vacuum deposition method, the solution application method, or the like, the layer hardly undergoes crystallization or the like and is excellent in stability over time. In addition, when the layer is formed by the application method, the film can be formed by using the constituent materials in combination with an appropriate binder resin.

Examples of the binder resin include, but not limited to, a polyvinyl carbazole resin, a polycarbonate resin, a polyester resin, an ABS resin, an acrylic resin, a polyimide resin, a phenol resin, an epoxy resin, a silicone resin, and a urea resin.

In addition, one kind of those binder resins may be used alone as a homopolymer or a copolymer, or two or more kinds thereof may be used as a mixture. Further, a known additive, such as a plasticizer, an antioxidant, or a UV absorber, may be used in combination as required.

[Application of Organic Light Emitting Element]

The organic light emitting element of the present invention can be used as a constituent member for a display apparatus or a lighting apparatus. In addition, the organic light emitting element finds use in applications such as an exposure light source for an image forming apparatus of an electrophotographic system, a backlight for a liquid crystal display apparatus, and a light-emitting apparatus including a white light source and a color filter. Examples of the color filter include filters that transmit light beams having three colors, i.e., red, green, and blue colors.

A display apparatus of the present invention includes the organic light emitting element of the present invention in its display portion. It is to be noted that the display portion includes a plurality of pixels.

In addition, the pixels each include the organic light emitting element of the present invention and a transistor as an example of an active element (switching element) or amplifying element for controlling emission luminance, and the anode or cathode of the organic light emitting element and the drain electrode or source electrode of the transistor are electrically connected to each other. Here, the display apparatus can be used as an image display apparatus for a PC or the like. The transistor is, for example, a TFT element and the TFT element is arranged on, for example, the insulating surface of a substrate. In addition, the TFT element preferably includes an electrode formed of a transparent oxide semiconductor.

The display apparatus may be an image information processing apparatus that includes an image input portion configured to input image information from, for example, an area CCD, a linear CCD, or a memory card, and displays an input image on its display portion.

In addition, the display portion of an imaging apparatus or an inkjet printer may have a touch panel function. The drive system of the touch panel function is not particularly limited.

In addition, the display apparatus may be used in the display portion of a multifunction printer.

A lighting apparatus is an apparatus for lighting, for example, the inside of a room. The lighting apparatus may emit light having any one of the following colors: white (having a color temperature of 4,200 K), neutral white (having a color temperature of 5,000 K), and colors ranging from blue to red colors.

A lighting apparatus of the present invention includes the organic light emitting element of the present invention and an AC/DC converter (circuit configured to convert an AC voltage into a DC voltage) connected to the organic light emitting element and supplying a drive voltage to the organic light emitting element. It is to be noted that the lighting apparatus may further include a color filter.

An image forming apparatus of the present invention is an image forming apparatus including: a photosensitive member; a charging portion configured to charge the surface of the photosensitive member; an exposure portion configured to expose the photosensitive member to form an electrostatic latent image; and a developing device configured to develop the electrostatic latent image formed on the surface of the photosensitive member. Here, an exposing unit, such as an exposing device, to be provided in the image forming apparatus includes the organic light emitting element of the present invention.

In addition, the organic light emitting element of the present invention can be used as a constituent member (light-emitting member) for an exposing device for exposing a photosensitive member. An exposing device including the organic light emitting element of the present invention is, for example, an exposing apparatus in which a plurality of the organic light emitting elements of the present invention are arranged to form a line along a predetermined direction.

Next, the display apparatus of the present invention is described with reference to the attached drawings. FIG. 1 is a schematic sectional view for illustrating an example of a display apparatus including an organic light emitting element and a switching element (TFT element) connected to the organic light emitting element. It is to be noted that the organic light emitting element of the present invention is used as the organic light emitting element constituting a display apparatus 1 of FIG. 1.

The display apparatus 1 of FIG. 1 includes a substrate 11 made of glass or the like and a moisture-proof film 12 for protecting TFT elements 18 serving as the switching element or an organic compound layer, the film being formed on the substrate. In addition, a metal gate electrode 13 is denoted by reference numeral 13, a gate insulating film 14 is denoted by reference numeral 14, and a semiconductor layer is denoted by reference numeral 15.

The TFT element 18 includes the semiconductor layer 15, a drain electrode 16, and a source electrode 17. An insulating film 19 is formed on the TFT element 18. An anode 21 constituting the organic light emitting element and the source electrode 17 are connected to each other through a contact hole 20.

It is to be noted that a system for the electrical connection between the electrode (anode or cathode) in the organic light emitting element and the electrode (source electrode or drain electrode) in the TFT is not limited to the aspect illustrated in FIG. 1. In other words, one of the anode and the cathode, and one of the source electrode and drain electrode of the TFT element only need to be electrically connected to each other.

Although a plurality of organic compound layers are illustrated like one layer in the display apparatus 1 of FIG. 1, an organic compound layer 22 may be a plurality of layers. A first protective layer 24 and a second protective layer 25 for suppressing the degradation of the organic light emitting element are formed on a cathode 23.

When the display apparatus 1 of FIG. 1 is a display apparatus that emits white light, an emission layer in the organic compound layer 22 in FIG. 1 may be a layer obtained by mixing a red light-emitting material, a green light-emitting material, and a blue light-emitting material. In addition, the layer may be a stacked emission layer obtained by stacking a layer formed of the red light-emitting material, a layer formed of the green light-emitting material, and a layer formed of the blue light-emitting material. Further, alternatively, the following aspect is permitted: the layer formed of the red light-emitting material, the layer formed of the green light-emitting material, and the layer formed of the blue light-emitting material are, for example, arranged side by side to form domains in one emission layer.

Although the transistor is used as the switching element in the display apparatus 1 of FIG. 1, an MIM element may be used instead of the transistor as the switching element.

In addition, the transistor to be used in the display apparatus 1 of FIG. 1 is not limited to a transistor using a monocrystalline silicon wafer and may be a thin-film transistor including an active layer on the insulating surface of a substrate. A thin-film transistor using monocrystalline silicon as the active layer, a thin-film transistor using non-monocrystalline silicon, such as amorphous silicon or microcrystalline silicon, as the active layer, a thin-film transistor using a non-monocrystalline oxide semiconductor, such as an indium zinc oxide or an indium gallium zinc oxide, as the active layer, or an organic transistor using an organic film as the active layer is also permitted. It is to be noted that the thin-film transistor is also called a TFT element.

The channel portion of the switching element according to this embodiment may contain an oxide semiconductor.

In the switching element, the oxide semiconductor portion may be amorphous, may be crystalline, or may be a mixture of both the states. The crystal may be any one of a single crystal, a microcrystal, and a crystal whose specific axis, such as a C-axis, is oriented, or may be a mixture of at least any two kinds thereof.

The organic light emitting element including such switching element may be used in an image display apparatus in which each organic light emitting element is provided as a pixel, or may be used as a lighting apparatus or as an exposure portion for exposing a photosensitive member of an image forming apparatus of an electrophotographic system, such as a laser beam printer or a copying machine.

The transistor in the display apparatus 1 of FIG. 1 may be formed in a substrate such as a Si substrate. Here, the phrase "formed in a substrate" means that the transistor is produced by processing the substrate itself such as a Si substrate. In other words, the presence of the transistor in the substrate can be regarded as follows: the substrate and the transistor are integrally formed.

Whether the transistor is provided in the substrate is selected depending on definition. In the case of, for example, a definition of about a QVGA per inch, the organic light emitting element is preferably provided in the Si substrate.

As described above, the driving of the display apparatus using the organic light emitting element of the present invention enables display that has good image quality and is stable over a long time period.

Figure 2:
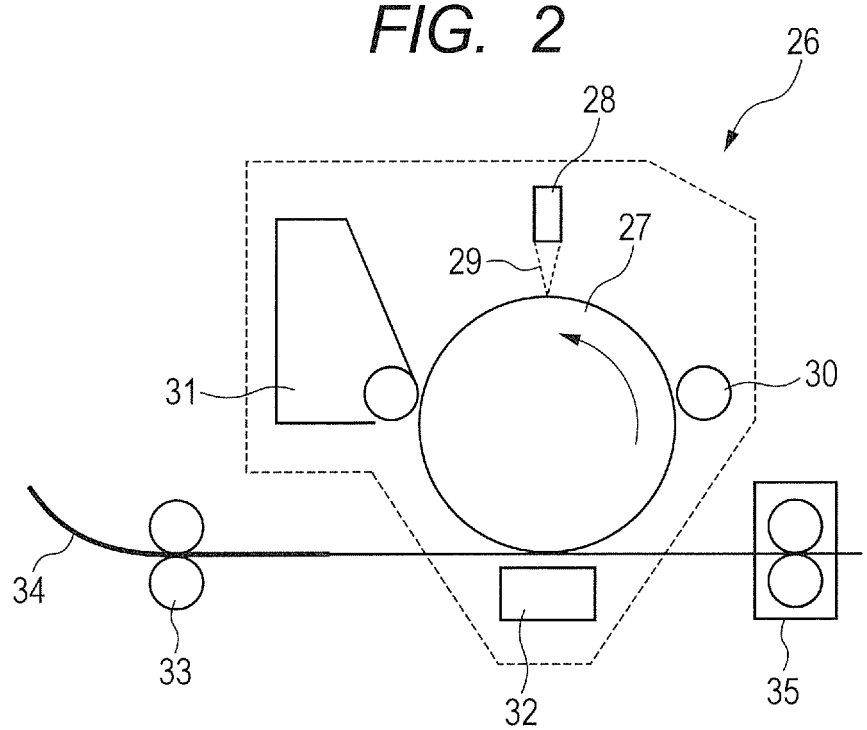
FIG. 2 is a schematic view for illustrating an example of an image forming apparatus including the organic light emitting element according to the present invention.

Next, other applications of the organic light emitting element of the present invention are described. FIG. 2 is a schematic view for illustrating an example of an image forming apparatus including the organic light emitting element according to the present invention. An image forming apparatus 26 of FIG. 2 includes a photosensitive member 27, an exposure light source 28, a developing device 30, a charging portion 31, a transferring device 32, a conveying roller 33, and a fixing device 35.

In the image forming apparatus 26 of FIG. 2, light 29 is applied from the exposure light source 28 to the photosensitive member 27, whereby an electrostatic latent image is formed on the surface of the photosensitive member 27. In the image forming apparatus 26 of FIG. 2, the exposure light source 28 includes a plurality of the organic light emitting elements according to the present invention. In addition, in the image forming apparatus 26 of FIG. 2, the developing device 30 has toner or the like. In the image forming apparatus 26 of FIG. 2, the charging portion 31 is provided for charging the photosensitive member 27. In the image forming apparatus 26 of FIG. 2, the transferring device 32 is provided for transferring a developed image onto a recording medium 34, such as paper. It is to be noted that the recording medium 34 is conveyed by the conveying roller 33 to the transferring device 32. In the image forming apparatus 26 of FIG. 2, the fixing device 35 is provided for fixing the image formed on the recording medium 34.

Figure 3A:
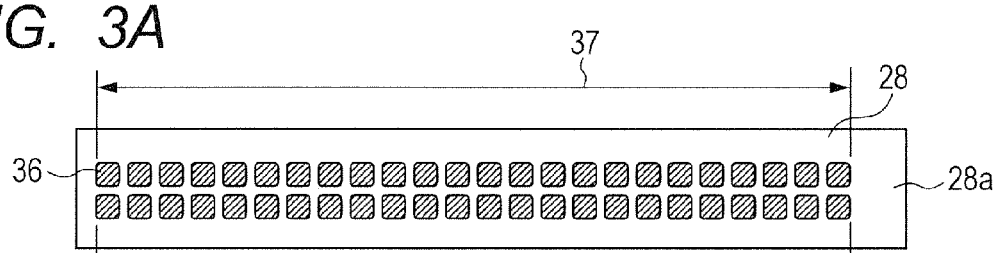
FIGS. 3A and 3B are schematic plan views for illustrating specific examples of an exposure light source constituting the image forming apparatus of FIG. 2.
Figure 3B:
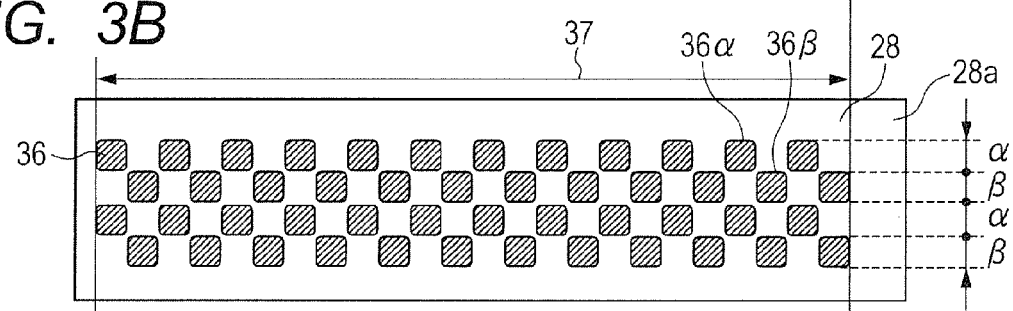
Figure 3C:
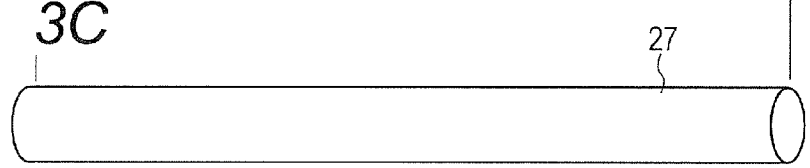
FIG. 3C is a schematic view for illustrating a specific example of a photosensitive member constituting the image forming apparatus of FIG. 2.

FIG. 3A and FIG. 3B are schematic plan views for illustrating specific examples of the exposure light source constituting the image forming apparatus 26 of FIG. 2, and FIG. 3C is a schematic view for illustrating a specific example of the photosensitive member constituting the image forming apparatus 26 of FIG. 2. It is to be noted that FIG. 3A and FIG. 3B have the following feature in common: a plurality of emission portions 36 each including the organic light emitting element are arranged on an elongated substrate 28a of the exposure light source 28. In addition, a double-headed arrow denoted by reference numeral 37 represents a column direction in which the emission portions 36 are arranged. The column direction is the same as the direction of the axis about which the photosensitive member 27 rotates.

Incidentally, FIG. 3A is an illustration of a form in which the plurality of emission portions 36 are arranged along the axis direction of the photosensitive member 27. On the other hand, FIG. 3B is an illustration of a form in which the emission portions 36 are alternately arranged in the column direction in a first column α and a second column β. In FIG. 3B, the first column α and the second column β, are arranged at different positions in a row direction.

In addition, in FIG. 3B, while a plurality of emission portions 36α are arranged at a certain interval in the first column α, the second column β has an emission portion 36β at a position corresponding to an interval between the emission portions 36α in the first column α. That is, in the exposure light source of FIG. 3B, the plurality of emission portions are arranged at a certain interval in the row direction as well.

It is to be noted that the following rewording is permitted: the exposure light source of FIG. 3B is in a state in which the emission portions (36α and 36β) constituting the exposure light source are arranged in, for example, a lattice, hound's-tooth, or checkered pattern.

Figure 4:
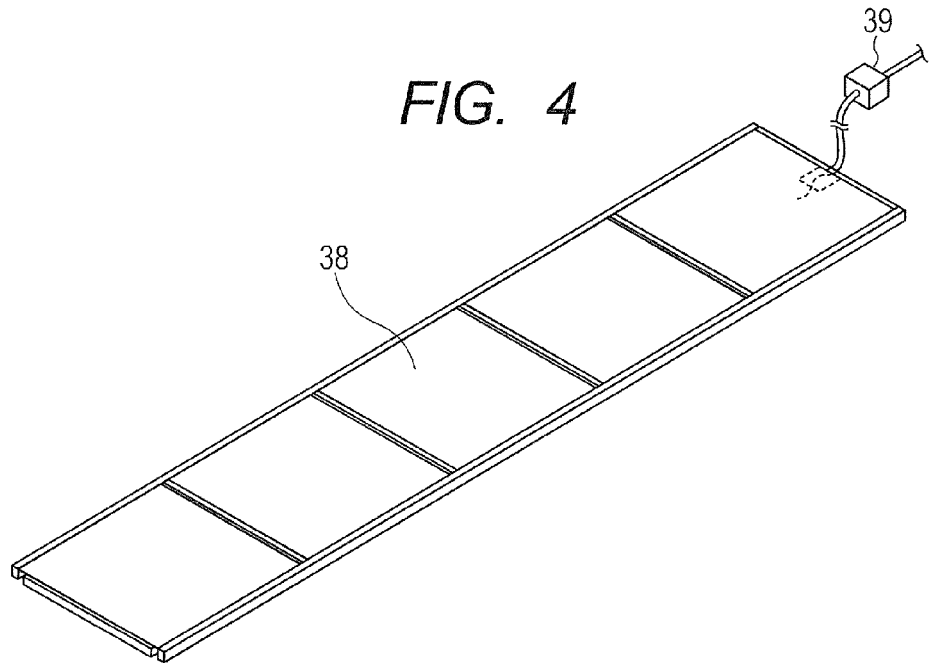
FIG. 4 is a schematic view for illustrating an example of a lighting apparatus including the organic light emitting element according to the present invention.

FIG. 4 is a schematic view for illustrating an example of a lighting apparatus including the organic light emitting element according to the present invention. The lighting apparatus of FIG. 4 includes an organic light emitting element 38 arranged on a substrate (not shown) and an AC/DC converter circuit 39. In addition, the lighting apparatus of FIG. 4 may include a heat sink (not shown) corresponding to a heat discharging portion for discharging heat in the apparatus to the outside on, for example, a substrate surface on a side opposite to the side on which the organic light emitting element 38 is mounted.

[Other Applications of Organic Compound Represented by General Formula [1]]

Incidentally, the organic compound represented by the general formula [1] can be utilized as a constituent material for an organic electric field element except the organic light emitting element, specifically a constituent material for a member having a function of injecting electrons because of the electron injection property of the compound. The term "organic electric field element" as used herein refers to an electric field element including: a pair of electrodes; and an organic functional layer arranged between the pair of electrodes and containing the organic compound represented by the general formula [1]. Examples of the organic electric field element except the organic light emitting element in which the organic compound represented by the general formula [1] can be utilized include non-light emitting electric field elements, such as an organic thin-film transistor (organic TFT) and an organic solar cell.

EXAMPLES

Hereinafter, the present invention is described in detail by way of Examples, but the present invention is not limited to Examples described below.

[Synthesis Example of Biacridinidene Compound]

The compound (biacridinidene compound) represented by the general formula [1] to be used in the present invention can be synthesized with reference to The Journal of Biological Chemistry, Vol. 277, No. 7, p. 5506 (2002). Specifically, the compound can be synthesized by: adding zinc to acetone or the like to be used as a solvent; then dropping concentrated hydrochloric acid to the mixture; adding an acridone derivative b-1 and a halogen body b-2 serving as raw materials to the mixture; and then stirring the reaction solution. However, a method except that described in The Journal of Biological Chemistry, Vol. 277, No. 7, p. 5506 (2002) may be adopted as a method of synthesizing the compound represented by the general formula [1].

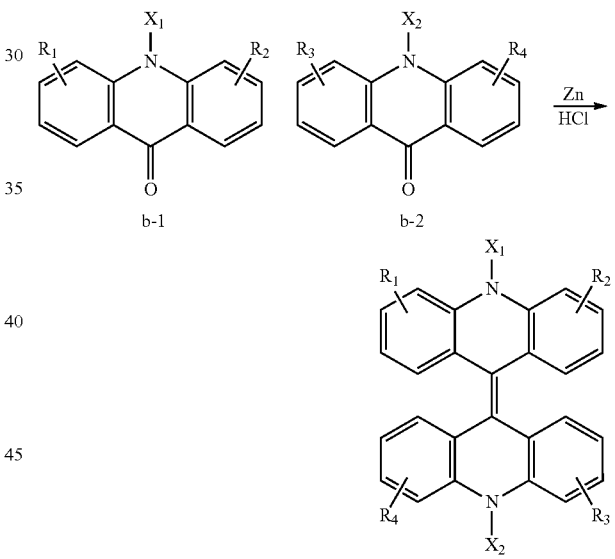

(Synthesis Example 1) Synthesis of Exemplified Compound A-1

Exemplified Compound A-1 was synthesized according to the following scheme.

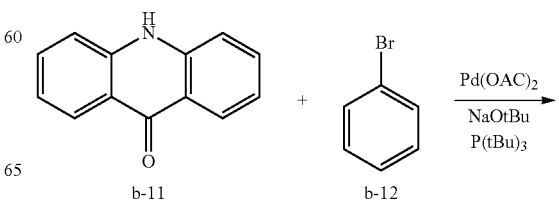

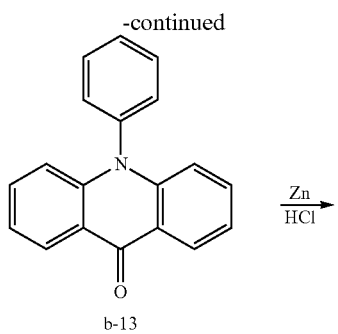

b-13

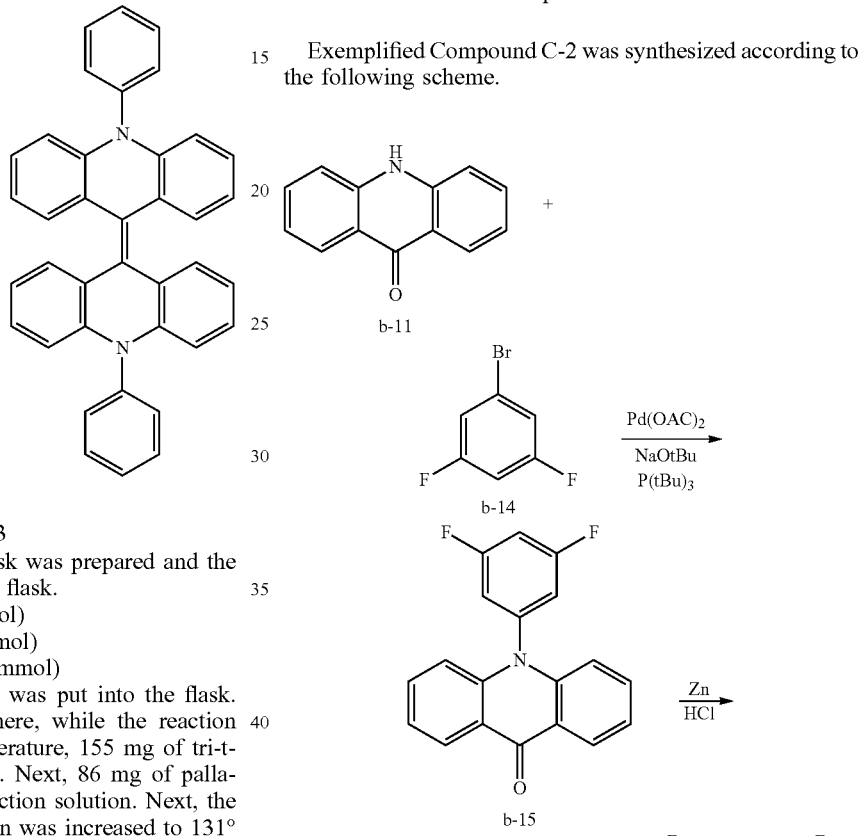

hours. After the completion of the reaction, 30 ml of water was put in the resultant, the precipitated yellow solid was filtered, and the solid was washed with water and methanol to provide 177 mg of Exemplified Compound A-1 as a yellow solid (yield: 69%).

Mass spectrometry confirmed that the compound had an $M^+$ of 510. In addition, differential scanning calorimetry (DSC) confirmed that the compound had a glass transition temperature of 245° C.

(Synthesis Example 2) Synthesis of Exemplified Compound C-2

Exemplified Compound C-2 was synthesized according to the following scheme.

(1) Synthesis of Compound b-13

First, a 200-ml three-necked flask was prepared and the following reagents were put in the flask.
Compound b-11: 1.50 g (7.68 mmol)
Compound b-12: 2.41 g (15.36 mmol)
Sodium t-butoxide: 1.47 g (15.36 mmol)

Next, 100 ml of chlorobenzene was put into the flask. After that, in a nitrogen atmosphere, while the reaction solution was stirred at room temperature, 155 mg of tri-t-butylphosphine was added thereto. Next, 86 mg of palladium acetate was added to the reaction solution. Next, the temperature of the reaction solution was increased to 131° C., and then the solution was stirred at the temperature (131° C.) for 5 hours. After the completion of the reaction, 100 ml of water was put into the resultant, and then an organic layer was extracted with chloroform. Next, the organic layer was dried with anhydrous sodium sulfate, and was then concentrated under reduced pressure to provide a crude product. Next, the crude product was purified with a silica gel column (mixed developing solvent containing toluene and ethyl acetate) to provide 1.31 g of a compound b-13 as a white solid (yield: 63%).

(2) Synthesis of Exemplified Compound A-1

First, a 50-ml three-necked flask was prepared and 30 ml of acetone was put into the flask, followed by bubbling with argon for 15 minutes. Next, the following reagents were put in the flask.
Compound b-13: 271 mg (1.0 mmol)
Zinc powder: 1.30 g (20.0 mmol)

Next, the reaction solution was heated to 50° C. and stirred at the temperature (50° C.) for 30 minutes. Next, while the reaction solution was cooled with ice, 12.0 ml of concentrated hydrochloric acid was dropped to the solution over 30 minutes. After that, a reaction was advanced by stirring the reaction solution at room temperature for 20

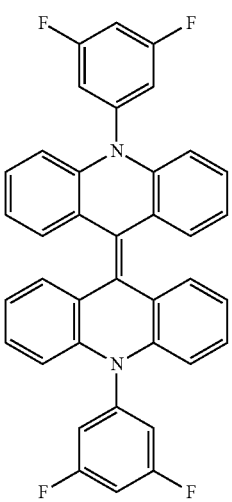

(1) Synthesis of Compound b-15

First, a 500-ml three-necked flask was prepared and the following reagents were put into the flask.

Compound b-11: 1.20 g (4.40 mmol)
Compound b-14: 2.40 g (12.4 mmol)
Sodium t-butoxide: 1.20 g (12.5 mmol)

Next, 250 ml of o-xylene was loaded into the flask. After that, in a nitrogen atmosphere, while the reaction solution was stirred at room temperature, 120 mg of tri-t-butylphosphine was added thereto. Next, 70 mg of palladium acetate was added to the reaction solution. Next, the temperature of the reaction solution was increased to 144° C., and then the solution was stirred at the temperature (144° C.) for 5 hours. After the completion of the reaction, 100 ml of water was put into the resultant, and then an organic layer was extracted with toluene. Next, the organic layer was dried with anhydrous sodium sulfate, and was then concentrated under reduced pressure to provide a crude product. Next, the crude product was purified by silica gel column chromatography (mixed developing solvent containing toluene and ethyl acetate) to provide 0.74 g of a compound b-15 as a white solid (yield: 55%).

(2) Synthesis of Exemplified Compound C-2

First, a 50-ml three-necked flask was prepared and 25 ml of acetone was @laced in the flask, followed by bubbling with argon for 15 minutes. Next, the following reagents were put in the flask.

Compound b-15: 276 mg (0.90 mmol)
Zinc powder: 1.17 g (18.0 mmol)

Next, the reaction solution was heated to 50° C. and stirred at the temperature (50° C.) for 30 minutes. Next, while the reaction solution was cooled with ice, 10.8 ml of concentrated hydrochloric acid was dropped to the solution over 30 minutes. After that, a reaction was advanced by stirring the reaction solution at room temperature for 20 hours. After the completion of the reaction, 25 ml of water was put in the resultant, the precipitated yellow solid was filtered, and the solid was washed with water and methanol to provide 124 mg of Exemplified Compound C-2 as a yellow solid (yield: 47%).

Mass spectrometry confirmed that the compound had an M⁺ of 582.

Synthesis Examples 3 to 8

The following exemplified compounds were each synthesized by the same method as that of Synthesis Example 2 with the exception that in the section (1) of Synthesis Example 2, an acridone derivative shown in Table 1 below was used instead of the compound b-11 and a halogen body shown in Table 1 below was used instead of the compound b-14.

TABLE 1

| Exemplified Compound | Acridone derivative | Halogen body |
|---|---|---|
| A-2 (Synthesis Example 3) | 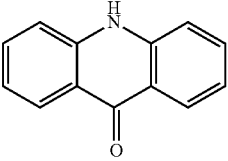 [SMILES: O=c1c2ccccc2[nH]c2ccccc12] |  |
| A-8 (Synthesis Example 4) | 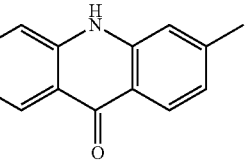 | 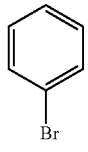 |
| B-2 (Synthesis Example 5) | 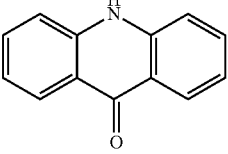 | 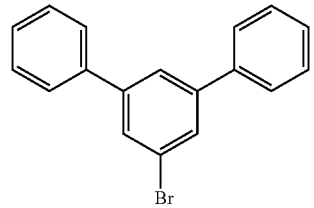 [SMILES: Brc1cc(-c2ccccc2)cc(-c2ccccc2)c1] |
| B-3 (Synthesis Example 6) | 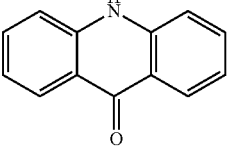 | 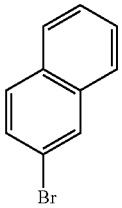 [SMILES: Brc1ccc2ccccc2c1] |

TABLE 1-continued

| Exemplified Compound | Acridone derivative | Halogen body |
|---|---|---|
| B-8 (Synthesis Example 7) | | |
| C-10 (Synthesis Example 8) | | |

Example 1

In this example, an organic light emitting element in which an anode, a hole transport layer, an emission layer, an electron transport layer, an electron injection layer, and a cathode were stacked in the mentioned order on a substrate was produced. It is to be noted that in this example, the electron injection layer is a stack formed of two layers. Here, part of the materials used in this example are listed below.

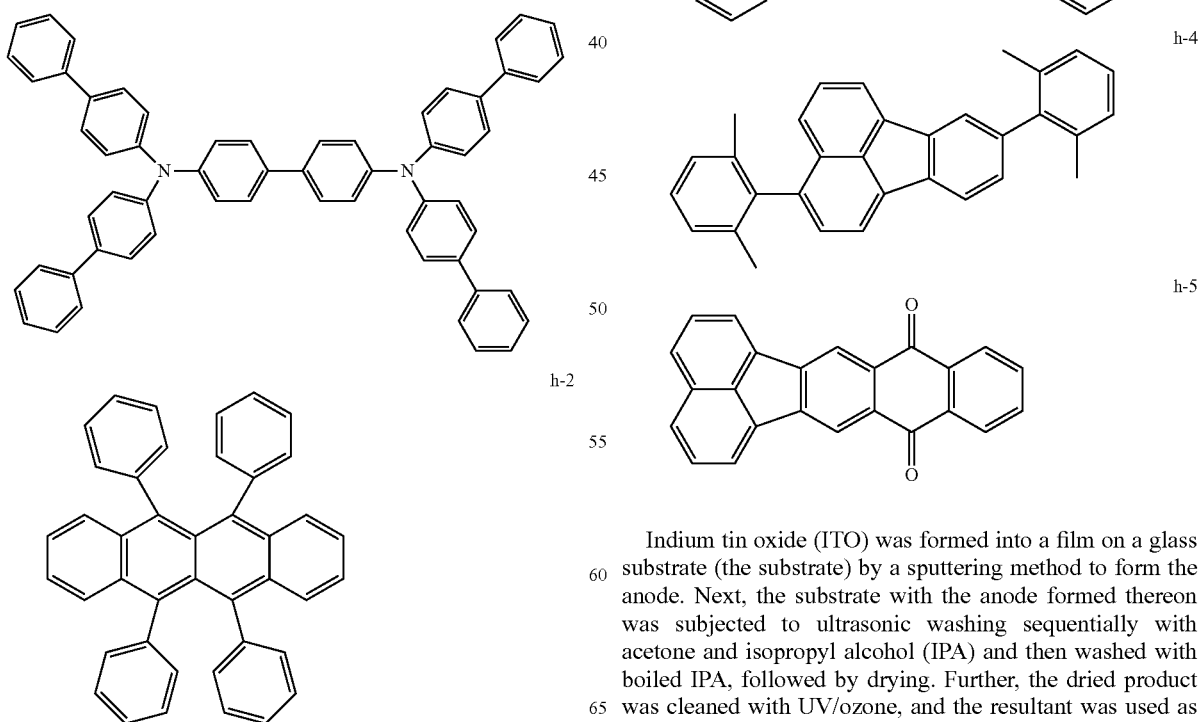

Indium tin oxide (ITO) was formed into a film on a glass substrate (the substrate) by a sputtering method to form the anode. Next, the substrate with the anode formed thereon was subjected to ultrasonic washing sequentially with acetone and isopropyl alcohol (IPA) and then washed with boiled IPA, followed by drying. Further, the dried product was cleaned with UV/ozone, and the resultant was used as a transparent conductive support substrate in the following steps.

Next, organic compound layers and an electrode layer shown in Table 2 below were continuously formed on the transparent conductive support substrate by utilizing vacuum deposition based on resistance heating in a vacuum chamber at $10^{-5}$ Pa. Thus, the organic light emitting element was produced.

TABLE 2

| Constituent material | | Thickness [nm] |
|---|---|---|
| Hole transport layer | Compound h-1 | 40 |
| Emission layer | Guest: h-3 (weight concentration[Note 1]: 0.5%) Host: h-2 (weight concentration[Note 1]: 99.5%) | 20 |
| Electron transport layer | Compound h-4 | 10 |
| Second electron injection layer | Compound h-5 | 10 |
| Organic functional layer (first electron injection layer) | Exemplified Compound A-1 | 3 |
| Metal electrode layer (cathode) | Al | 150 |

[Note 1] A weight concentration with respect to the entirety of the emission layer A voltage of 10 V was applied to the organic light emitting element obtained in this example. As a result, red light emission derived from the light-emitting dopant h-3 having a luminance of 2.9 cd/m² and CIE chromaticity coordinates of (0.64, 0.35) was observed.

Examples 2 to 6

Organic light emitting elements were each produced by the same method as that of Example 1 with the exception that in Example 1, the combination of the electron transport layer, the first electron injection layer, and the second electron injection layer was changed as shown in Table 3 below.

TABLE 3

| | Electron transport layer | Second electron injection layer | First electron injection layer (organic functional layer) |
|---|---|---|---|
| Example 2 | h-4 | h-7 | A-2 |
| Example 3 | h-4 | h-8 | A-8 |
| Example 4 | h-6 | h-5 | B-2 |
| Example 5 | h-6 | h-7 | A-2 |
| Example 6 | h-6 | h-8 | B-8 |

In addition, part of the materials used in Examples 2 to 6 are listed below.

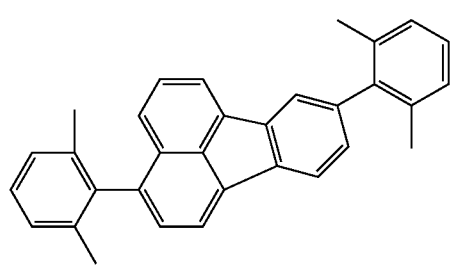

h-4

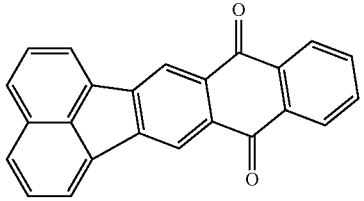

h-5

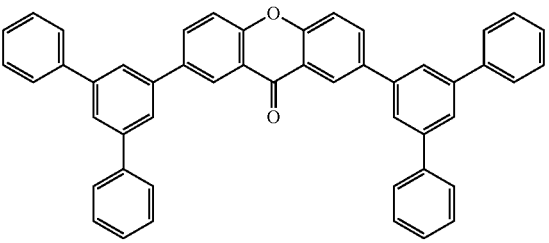

h-6

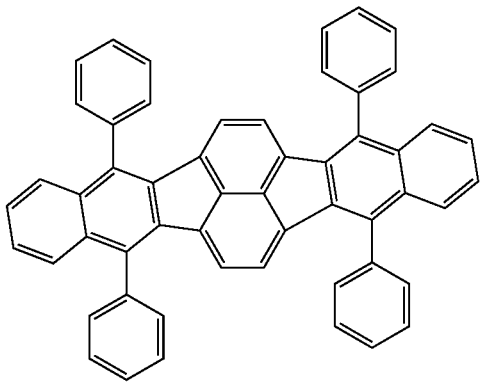

h-7

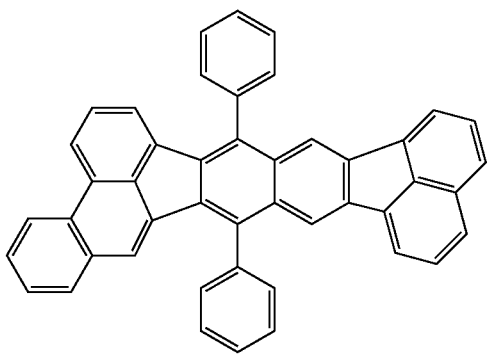

h-8

The organic light emitting elements produced in Examples 2 to 6 were each evaluated by the same method as that of Example 1. The results of the evaluations of the elements are shown in Table 4 below.

TABLE 4

| | Current efficiency[Note 1] [cd/A] | CIE chromaticity coordinates[Note 1] (x, y) |
|---|---|---|
| Example 2 | 3.0 | (0.64, 0.35) |
| Example 3 | 2.8 | (0.65, 0.35) |
| Example 4 | 2.7 | (0.65, 0.35) |
| Example 5 | 2.8 | (0.64, 0.35) |
| Example 6 | 2.7 | (0.65, 0.35) |

[Note 1] Applied voltage: 10 V

Example 7

An organic light emitting element was produced by the same method as that of Example 1 with the exception that in Example 1, an electron injection layer to be described below was formed instead of the formation of the intervening layer and the organic functional layer.

(Formation of Electron Injection Layer)

An electron injection layer having a thickness of 10 nm was formed by codepositing Exemplified Compound A-2 and the compound h-5 from the vapor onto the electron transport layer so that a weight concentration ratio "Exemplified Compound A-2:Compound h-5" in the layer became 50:50.

An applied voltage of 10 V was applied to the organic light emitting element of this example. As a result, red light emission derived from the light-emitting dopant h-3 having a luminance of 2.0 cd/m$^2$ and CIE chromaticity coordinates of (0.65, 0.35) was observed.

According to the present invention, the organic light emitting element that has high moisture resistance, is driven at a low voltage, has high efficiency, and has a long lifetime can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-007532, filed Jan. 19, 2015, which is hereby incorporated by reference herein in its entirety.

What is claimed is:

1. An organic light emitting element, comprising:
an anode;
a cathode; and
an organic compound layer disposed between the anode and the cathode,
wherein:
the organic compound layer comprises an organic functional layer; and
the organic functional layer comprises an organic compound represented by the following general formula [1]:

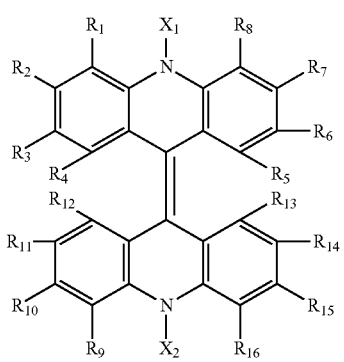

in the general formula [1], $X_1$ and $X_2$ each represent an aryl group, and the aryl group may further have a halogen atom or an alkyl group, and $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$, and $R_{16}$ each represent a hydrogen atom or a substituent selected from a halogen atom, an alkyl group, and an aryl group, and when any one of $R_1$ to $R_{16}$ represents an aryl group, the aryl group may further have a halogen atom or an alkyl group that may have a halogen atom.

2. The organic light emitting element according to claim 1, wherein $X_1$ and $X_2$ each represent a phenyl group.

3. The organic light emitting element according to claim 1, wherein $X_1$ and $X_2$ each represent an aryl group containing two or more benzene rings.

4. The organic light emitting element according to claim 1, wherein one of $X_1$ and $X_2$ represents an aryl group having a fluorine atom.

5. The organic light emitting element according to claim 1, wherein the organic functional layer is disposed between the cathode and an emission layer.

6. The organic light emitting element according to claim 5, wherein the organic functional layer is in contact with the cathode.

7. An organic light emitting element according to claim 6, wherein:
the organic functional layer contains a first organic compound and a second organic compound;
the first organic compound comprises the organic compound represented by the general formula [1]; and
the second organic compound comprises an organic compound of a kind different from that of the organic compound represented by the general formula [1].

8. The organic light emitting element according to claim 6, wherein the organic compound layer further includes a layer that contains an organic compound of a kind different from that of the organic compound represented by the general formula [1], and that is adjacent to the organic functional layer on the emission layer side.

9. A display apparatus, comprising a plurality of pixels, wherein at least one of the plurality of pixels includes the organic light emitting element of claim 1, and an active element connected to the organic light emitting element.

10. An image information processing apparatus, comprising:
an input portion configured to input image information; and
a display portion configured to display an image,
wherein the display portion comprises the display apparatus of claim 9.

11. A lighting apparatus, comprising:
the organic light emitting element of claim 1; and
an AC/DC converter configured to supply a drive voltage to the organic light emitting element.

12. An image forming apparatus, comprising:
a photosensitive member;
a charging portion configured to charge a surface of the photosensitive member;
an exposure portion configured to expose the photosensitive member; and
a developing device configured to develop an electrostatic latent image formed on the surface of the photosensitive member,
wherein the exposure portion includes the organic light emitting element of claim 1.

13. An exposing apparatus configured to expose a photosensitive member, comprising a plurality of the organic light emitting elements of claim 1, wherein the plurality of the organic light emitting elements are arranged in a line.

14. An organic electric field element, comprising:
a pair of electrodes; and
an organic functional layer disposed between the pair of electrodes, wherein the organic functional layer comprises an organic compound represented by the following general formula [1]:

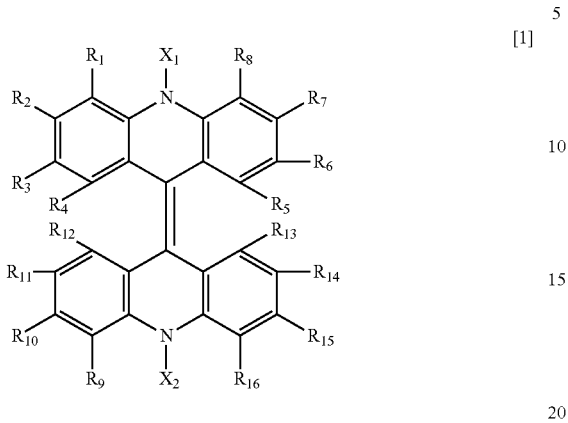

in the general formula [1], $X_1$ and $X_2$ each represent an aryl group, and the aryl group may further have a halogen atom or an alkyl group, and $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$, and $R_{16}$ each represent a hydrogen atom or a substituent selected from a halogen atom, an alkyl group, and an aryl group, and when any one of $R_1$ to $R_{16}$ represents an aryl group, the aryl group may further have a halogen atom or an alkyl group that may have a halogen atom.

* * * * *